United States Patent
Xu et al.

(10) Patent No.: US 11,079,515 B2
(45) Date of Patent: Aug. 3, 2021

(54) MICRO LENS TIME-OF-FLIGHT SENSOR HAVING MICRO LENS HEIGHTS THAT VARY BASED ON IMAGE HEIGHT

(71) Applicant: MICROSOFT TECHNOLOGY LICENSING, LLC, Redmond, WA (US)

(72) Inventors: Zhanping Xu, Sunnyvale, CA (US); Vei-Han Chan, San Jose, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/719,968

(22) Filed: Dec. 18, 2019

(65) Prior Publication Data
US 2021/0190996 A1   Jun. 24, 2021

(51) Int. Cl.
*G02B 3/00* (2006.01)
*G01B 11/24* (2006.01)

(52) U.S. Cl.
CPC ............ *G02B 3/0043* (2013.01); *G01B 11/24* (2013.01)

(58) Field of Classification Search
CPC .............................. G01B 11/24; G02B 3/0043
USPC ................................................ 356/600–640
See application file for complete search history.

(56) References Cited

U.S. PATENT DOCUMENTS

| | | |
|---|---|---|
| 4,864,395 A | 9/1989 | Tajima |
| 5,579,107 A | 11/1996 | Wright et al. |
| 5,581,345 A | 12/1996 | Oki et al. |
| 6,323,942 B1 | 11/2001 | Bamji |
| 6,515,740 B2 | 2/2003 | Bamji et al. |
| 6,580,496 B2 | 6/2003 | Bamji et al. |
| 6,697,010 B1 | 2/2004 | Lam |
| 6,906,793 B2 | 6/2005 | Bamji et al. |
| 7,589,316 B2 | 9/2009 | Dunki-Jacobs |
| 7,719,662 B2 | 5/2010 | Bamji et al. |

(Continued)

FOREIGN PATENT DOCUMENTS

| | | |
|---|---|---|
| EP | 2116864 A1 | 11/2009 |
| EP | 2157401 A1 | 2/2010 |

(Continued)

OTHER PUBLICATIONS

"International Search Report and Written Opinion Issued in PCT Application No. PCT/US19/052531", dated Dec. 13, 2019, 11 Pages.

(Continued)

*Primary Examiner* — Tri T Ton
(74) *Attorney, Agent, or Firm* — Newport IP, LLC; Jacob P. Rohwer

(57) ABSTRACT

A three-dimensional time-of-flight (3D TOF) camera having a micro lens (ML) array configured with variable ML height and variable ML shift. The ML array includes micro lens that are configured to direct backscattered light that is transmitted through an image lens into corresponding pixels. Heights of individual micro lenses within the ML array vary according to image height. For example, the height of micro lenses at the center of the ML array, near the axis of the image lens, may be relatively larger than the height of other micro lenses toward the perimeter of the ML array. Furthermore, the shift of individual micro lenses with respect to corresponding pixels may also vary according to the image height. For example, the shift of micro lenses at the center of the ML array may be relatively smaller than the shift of the other micro lenses toward the perimeter of the ML array.

15 Claims, 17 Drawing Sheets

(56) References Cited

U.S. PATENT DOCUMENTS

| | | |
|---|---|---|
| 8,587,771 B2 | 11/2013 | Xu et al. |
| 9,580,496 B2 | 2/2017 | Gearing |
| 9,595,550 B2 | 3/2017 | Bamji |
| 2001/0022371 A1 | 9/2001 | Rhodes |
| 2006/0128087 A1 | 6/2006 | Bamji et al. |
| 2007/0127009 A1 | 6/2007 | Chen et al. |
| 2008/0068583 A1 | 3/2008 | Hiraide |
| 2008/0180650 A1 | 7/2008 | Lamesch |
| 2009/0237640 A1 | 9/2009 | Krikorian et al. |
| 2011/0292380 A1 | 12/2011 | Bamji |
| 2012/0013887 A1 | 1/2012 | Xu et al. |
| 2012/0044406 A1 | 2/2012 | Shimoda et al. |
| 2013/0120623 A1 | 5/2013 | Kim |
| 2015/0001664 A1 | 1/2015 | Van der tempel et al. |
| 2016/0181314 A1 | 6/2016 | Wan et al. |
| 2017/0146657 A1 | 5/2017 | Xu |
| 2019/0355136 A1 | 11/2019 | Ortiz et al. |
| 2020/0116862 A1 | 4/2020 | Xu et al. |

FOREIGN PATENT DOCUMENTS

| | | |
|---|---|---|
| JP | H09269372 A | 10/1997 |
| JP | 2000517427 A | 12/2000 |
| JP | 2006214998 A | 8/2006 |
| JP | 2008164496 A | 7/2008 |
| JP | 2009063303 A | 3/2009 |

OTHER PUBLICATIONS

"Office Action Issued in Korean Patent Application No. 10-2013-7001077", dated May 16, 2017, 4 Pages.
"Office Action Issued in European Patent Application No. 11807282.6", dated Jul. 24, 2014, 4 Pages.
"Office Action Issued in European Patent Application No. 11807282.6", dated Jan. 27, 2015, 4 Pages.
"Search Report Issued in European Patent Application No. 11807282.6", dated Apr. 17, 2013, 8 Pages.
"Non Final Office Action Issued in U.S. Appl. No. 15/421,821", dated Feb. 26, 2019, 9 Pages.
"Non Final Office Action Issued in U.S. Appl. No. 14/449,800", dated Aug. 23, 2016, 8 Pages.
"Non Final Office Action Issued in U.S. Appl. No. 12/658,806", dated Sep. 9, 2013, 8 Pages.
"Amendment and Response Filed in Chinese Patent Application No. 201110206379.8", dated Feb. 28, 2014, 15 PAGES.
"Amendment and Response Filed in Chinese Patent Application No. 201110206379.8.", dated Jul. 29, 2013, 16 Pages.
"First Office Action and Search Report Issued in Chinese Patent Application No. 201110206379.8", dated Nov. 2, 2012, 9 Pages.
"Second Office Action Issued in Chinese Patent Application No. 201110206379.8", dated May 14, 2013, 8 Pages.
"Office Action Issued in Japanese Patent Application No. 2013-520728", dated Feb. 19, 2015, 7 Pages.
"International Search Report and Written Opinion Issued in PCT Application No. PCT/US2011/42643", dated Dec. 22, 2011, 8 Pages.
"Application as Filed in U.S. Appl. No. 16/159,468", filed Oct. 12, 2018, 49 Pages.
Xu, et al., "Investigation of 3D-Imaging Systems Based on Modulated Light and Optical RF-Interferometry (ORFI)", Published by Shaker Verlag, Dec. 1999, 14 Pages.
"International Search Report and Written Opinion Issued in PCT Application No. PCT/US20/059917", dated Mar. 24, 2021, 18 Pages.

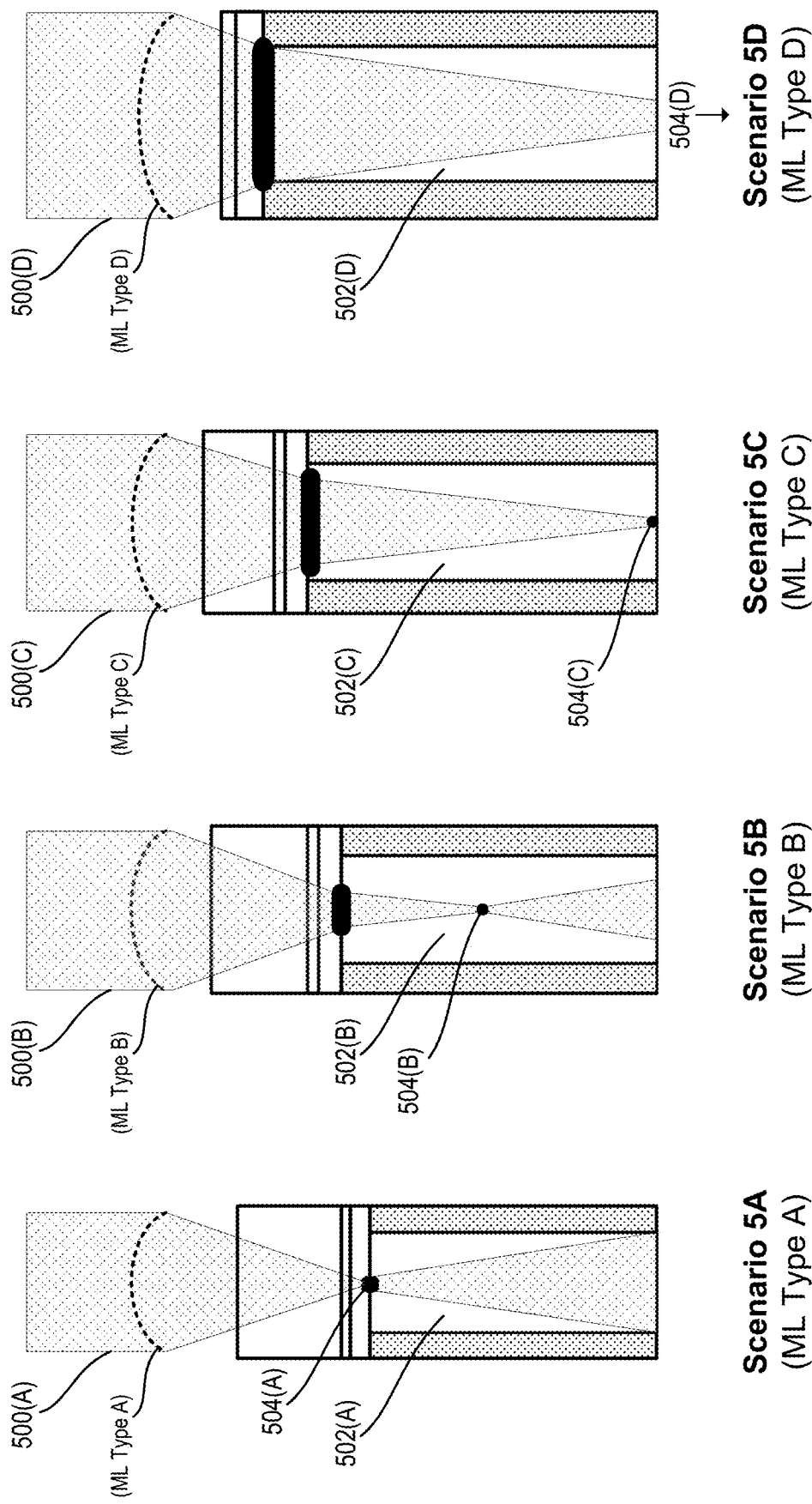

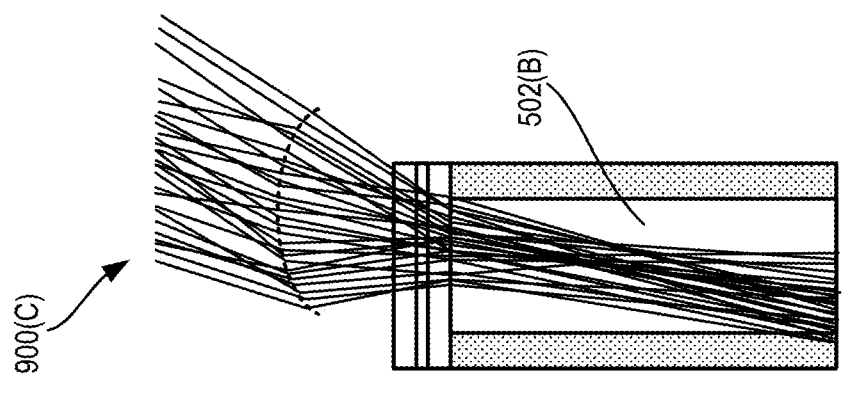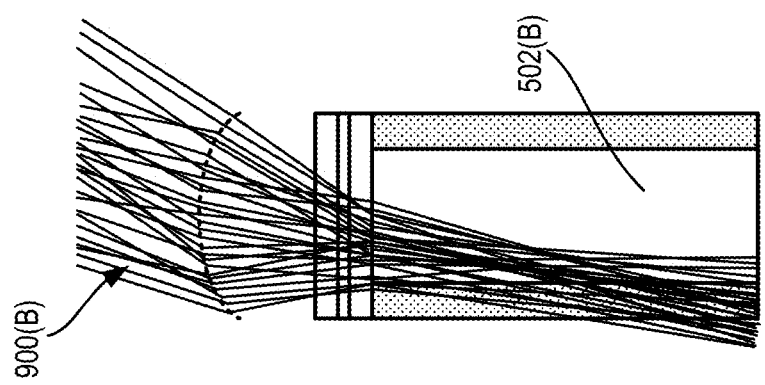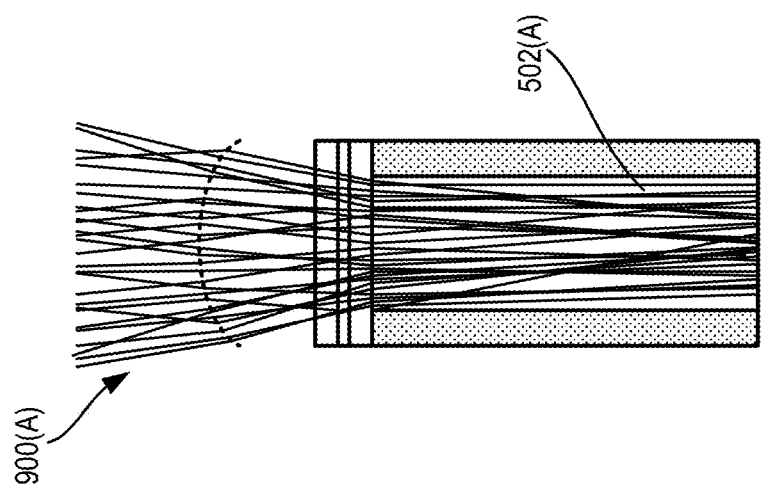
FIG. 9

MICRO LENS TIME-OF-FLIGHT SENSOR HAVING MICRO LENS HEIGHTS THAT VARY BASED ON IMAGE HEIGHT

BACKGROUND

Time of Flight (TOF) pixel-based 3D cameras are being deployed across an increasing number of industrial and consumer applications. Miniaturization of the TOF pixel-based cameras is desirable in many of these applications. In existing TOF pixel-based devices, arrays of micro lenses are incorporated to achieve the desired miniaturization. More specifically, these arrays of micro lenses are disposed between an image lens that receives and transmits backscattered light to an array of pixels that generate photoelectric signals when stricken with the backscattered light.

Unfortunately, the modulation efficiency with which the individual pixels are able to generate these photovoltaic signals typically decreases with increasing image height on the array of pixels. This is partly due to inefficiencies with which conventional designs for the arrays of micro lenses focus the backscattered light into a region of interest of a corresponding pixel.

It is with respect to these considerations and others that the disclosure made herein is presented.

SUMMARY

Technologies described herein provide for a three-dimensional time-of-flight (3D TOF) camera having a micro lens (ML) array configured with variable ML height and variable ML shift. In particular, the ML array includes a plurality of micro lens that are configured to direct backscattered light that is transmitted through an image lens into corresponding pixels. An image height for various individual pixels and/or individual micro lenses may be determined based on an axis of the image lens. In an exemplary embodiment, the height of individual micro lenses within the ML array vary according to the image height. For example, the height of micro lenses at the center of the ML array, near the axis of the image lens, may be relatively larger than the height of other micro lenses toward the perimeter of the ML array. Furthermore, the shift of individual micro lenses with respect to corresponding pixels may also vary according to the image height. For example, the shift of micro lenses at the center region of the ML array may be relatively smaller than the shift of the other micro lenses toward the perimeter of the ML array. As described in detail herein, the variable ML height and variable ML shift may be selected to maximize a volumetric optic power Hit Rate $R_{hit}$ experienced at individual pixels across various image heights. The result of maximizing this volumetric optic power Hit Rate $R_{hit}$ is increased modulation efficiency as compared to existing TOF pixel-based 3D cameras.

In an exemplary embodiment, a 3D TOF image camera includes a signal generator to generate a modulated electrical signal. The 3D TOF camera may further include a light emitter that is configured to emit modulated light based on the modulated electrical signals. The signal generator may simultaneously dispatch the modulated electric signals to a phase shifter. The 3D TOF camera further includes an image lens that receives backscattered light that is reflected by a physical object onto which the modulated light was emitted. Thus, the backscattered light that is received at the image lens includes at least a portion of the modulated light in addition to ambient light. The portion of the modulated light that is received at the image lens experiences a time delay to from the time to at which the modulated light is emitted by the light emitter. Specifically, the time delay to corresponds to an amount of time that it takes the modulated light to travel from the light emitter to the physical object and, upon being reflected, from the physical object to the image lens.

The 3D TOF camera further includes a micro lens time-of-flight (ML-TOF) sensor having a ML array and a pixel array. Specifically, the ML array is disposed between the image lens and onto the pixel array. The ML array includes a plurality of micro lenses (MLs) and the pixel array includes a plurality of pixels. Individual ones of the MLs may be positioned and/or sized to optimally focus rays of the reflected light with respect to individual ones of the pixels. For example, a first micro lens may be sized and positioned to focus rays of the reflected light with respect to a first pixel whereas an Nth micro lens may be sized and positioned to focus rays of the reflected light with respect to an Nth pixel. More specifically, the individual MLs may be sized and positioned with respect to the corresponding pixels to maximize a volumetric optic power Hit Rate $R_{hit}$ as defined herein.

In some embodiments, heights of the individual MLs within the ML array decrease with increasing radial distance from the axis. Stated alternatively, the heights of the individual MLs within the ML array are inversely related to the radial distance of those individual MLs from the axis. Additionally, or alternatively, shifts of the individual MLs with respect to a center of a corresponding pixel may increase with increasing radial distance from the axis. Stated alternatively, the positional shifts of the individual MLs with respect to a corresponding pixel are directly (i.e., as opposed to inversely) related to the radial distance of those individual MLs from the axis.

Individual ones of the pixels may include one or more photodetector cells that generate photoelectric signals when stricken with incident light. These photoelectric signals may be provided directly from the ML-TOF sensor to a controller which may analyze the photoelectric signal to determine per-pixel depth information associated with the physical object and any other objects in a Field-of-View of the 3D TOF camera.

This Summary is provided to introduce a selection of concepts in a simplified form that are further described below in the Detailed Description. This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

DRAWINGS

The Detailed Description is described with reference to the accompanying figures. In the figures, the left-most digit(s) of a reference number identifies the figure in which the reference number first appears. The same reference numbers in different figures indicates similar or identical items.

References made to individual items of a plurality of items can use a reference number followed by a parenthetical containing a number of a sequence of numbers to refer to each individual item. Generic references to the items may use the specific reference number without the sequence of numbers. For example, the items may be collectively referred to with the specific reference number preceding a corresponding parenthetical containing a sequence number.

FIG. 5 illustrates a plurality of ray tracing responses that are modeled based on various ML lens parameters and with incoming light modeled as columnated light that is parallel to an axis of an image lens.

FIG. 9 illustrates a plurality of ray tracing responses that demonstrate an effect of shifting a micro lens with respect to a region of interest of a pixel on the volumetric optic power Hit Rate.

DETAILED DESCRIPTION

Figure 1:
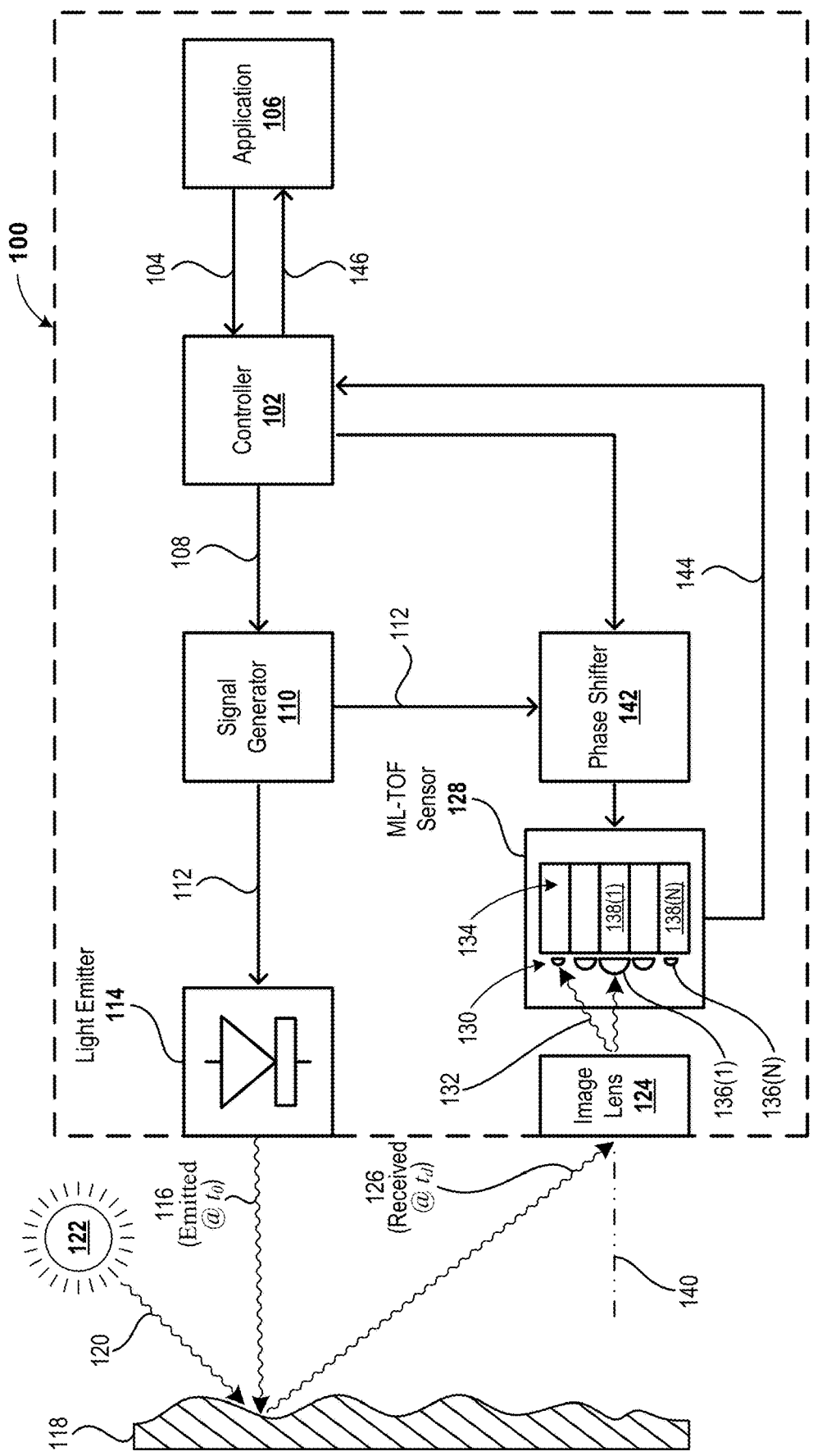
FIG. 1 illustrates a schematic diagram of a three-dimensional (3D) time-of-flight (TOF) camera having a micro lens (ML) array configured with variable ML height and shift, according to an exemplary embodiment of the present disclosure.

FIG. 1 illustrates a schematic diagram of a three-dimensional (3D) time-of-flight (TOF) camera 100 having a micro lens (ML) array 130 configured with variable ML height and shift, according to an exemplary embodiment of the present disclosure. In some embodiments, the 3D TOF camera 100 may include a controller 102 that is configured to provide output signals to and receive input signals from various components of the 3D TOF camera 100. As illustrated, the controller 102 is shown to be receiving one or more inputs signals 104 from an application 106. For example, the input signals 104 may include a request from the application 106 for depth data that may be generated by the 3D TOF camera 100. In plain terms, depth data may refer to one or more maps of per-pixel data containing depth-related information.

In response to the input signals 104 being received from the application 106, the controller 102 may output various control signals to cause operations to be performed by one or more other components of the 3D TOF camera 100. For example, as illustrated, the controller 102 is shown to be outputting control signals 108 to a signal generator 110 that is configured to generate modulated electrical signals 112. The signal generator 110 may generate the modulated electrical signals 112 in response to the control signals 108 being received from the controller 102. In some embodiments, the modulated electrical signals 112 may be any periodic modulated electrical signals. Additionally, or alternatively, the modulated electrical signals 112 may be frequency-modulated electrical signals. In embodiments in which the modulated electrical signals 112 are frequency modulated, the modulated electrical signals 112 may modulate in frequency. In embodiments in which the modulated electrical signals 112 are amplitude modulated, amplitude modulation may occur with a predetermined modulation frequency.

The 3D TOF camera 100 may further include a light emitter 114 that is configured to emit modulated light 116 based on the modulated electrical signals 112. For example, as illustrated, the modulated electrical signals 112 are output from the signal generator 110 to the light emitter 114 which in turn emits modulated light 116 in response to the modulated electrical signals 112. As further illustrated and describe in detail below, the signal generator 110 may simultaneously dispatch the modulated electric signals 112 to a phase shifter 142. An exemplary light emitter 114 may include, for example, a light-emitting diode (LED), a laser diode, or any other light source suitable for emitting modulated light 116 based on the modulated electrical signals 112. The modulated light 116 may be periodic-modulated in embodiments in which the modulated electrical signals 112 are periodic-modulated and frequency-modulated in embodiments in which the modulated electrical signals 112 are frequency-modulated. As illustrated, the modulated light 116 is emitted from the 3D TOF camera 100 toward a physical object 118 for which the requested depth data is to be generated. As further illustrated, ambient light 120 may also be emitted toward the physical object 118 from one or more ambient light sources 122. For example, the ambient light 120 may be emitted toward the physical object 118 from a light source (e.g., a light bulb, the sun, etc.) that generates light. Additionally, or alternatively, the ambient light 120 may be reflected toward the physical object 118 from an indirect passive light source (e.g., a wall, a mirror, etc.) that reflects at least a portion of the electromagnetic (EM) spectrum.

The 3D TOF camera 100 further includes an image lens 124 that receives backscattered light 126 that is reflected by the physical object 118. The backscattered light 126 that is received at the image lens 124 includes both a portion of the modulated light 116 and a portion of the ambient light 120. The portion of the modulated light 116 that is received at the image lens 124 experiences a time delay $t_d$ from the time to at which the modulated light 116 is emitted by the light emitter 114. Specifically, the time delay $t_d$ corresponds to an amount of time that it takes the modulated light 116 to travel from the light emitter 114 to the physical object 118 and, upon being reflected, from the physical object 118 to the image lens 124.

The 3D TOF camera 100 further includes a micro lens time-of-flight (ML-TOF) sensor 128 having a ML array 130 and a pixel array 134. As illustrated, the ML array 130 is disposed between the image lens 124 and onto the pixel array 134. The ML array 130 includes a plurality of micro lenses (MLs) 136 and the pixel array 134 includes a plurality of pixels 138. As described in more detail below, individual ones of the MLs 136 may be positioned and/or sized to optimally focus rays 132 of the reflected light 126 (which have passed through the image lens 124) with respect to individual ones of the pixels 138. For example, as illustrated, a first micro lens 136(1) is sized and positioned to focus rays 132 of the reflected light 126 with respect to a first pixel 138(1) whereas an Nth micro lens 136(N) is sized and positioned to focus rays 132 of the reflected light 126 with respect to an Nth pixel 138(N). As described in detail below, the individual MLs 136 may be sized and positioned with respect to the corresponding pixels 138 to maximize a volumetric optic power Hit Rate $R_{hit}$ as defined by Equations 9 and 10 below.

Figure 2A:
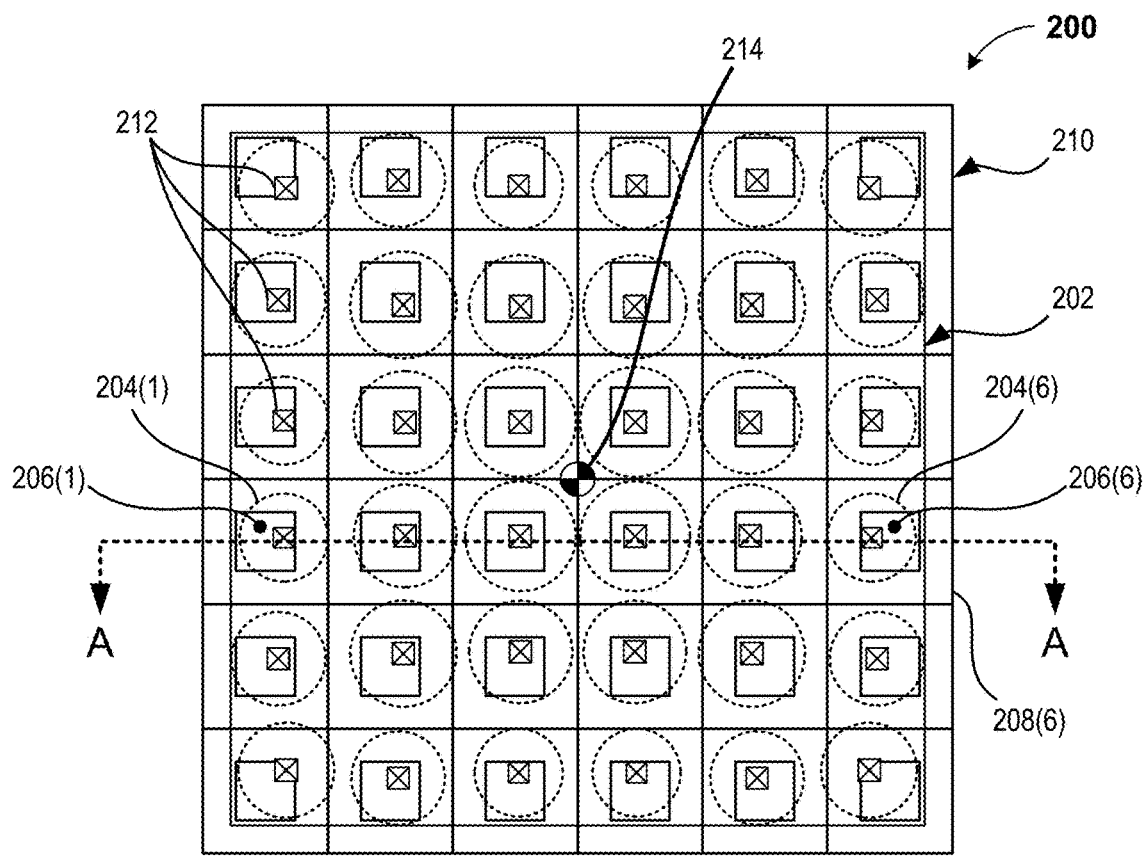
FIG. 2A illustrates a top view of an exemplary micro lens time-of-flight (ML-TOF) sensor having a ML array configured with variable ML height and shift, according to an exemplary embodiment of the present disclosure.
Figure 2B:
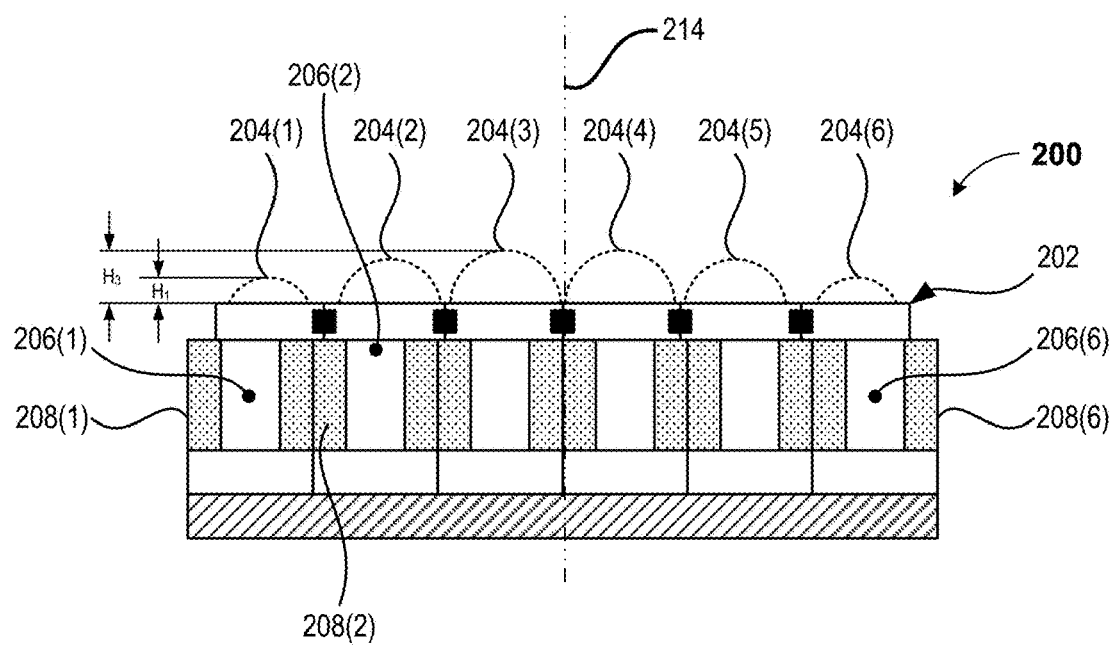
FIG. 2B illustrates a cross-sectional side view of the exemplary ML-TOF sensor of FIG. 2A—the cross-section taken along the line A-A of FIG. 2A.

With respect to the individual MLs 136 within the ML array 130 varying in size, the first ML 136(1) may be manufactured to a first height whereas the Nth ML 136(N) may be manufactured to an Nth height that is different than the first height. In some embodiments, heights of the individual MLs 136 within the ML array 130 may be varied according to a distance from an optical axis 140 of the image lens 124 (or any other suitable reference datum of the 3D TOF camera 100). As illustrated, for example, the first ML 136(1) is shown to be substantially centered on the axis 140 whereas the Nth ML 136(N) is shown to be offset from the axis 140 by some distance. Thus, the radial distance of the first ML 136(1) from the axis 140 is relatively less than the radial distance of the Nth ML 136(N) from the axis 140. In some embodiments, heights of the individual MLs 136 within the ML array 130 decrease with increasing radial distance from the axis 140. Stated alternatively, the heights (and/or width and/or curvature) of the individual MLs 136 within the ML array are inversely related to the radial distance of those individual MLs 136 from the axis 140. To illustratively convey this point, in FIG. 1 the first ML 136(1) is drawn at a relatively larger size as compared to the Nth ML 136(N). It is worth noting that although the MLs 136 are depicted as circular, this is a simplistic representation that intended to emphasis the variations between MLs. It will be appreciated by one skilled in the art that the actual shape of the MLs may be square with a spherical lens top. It is also worth noting that although the MLs 136 are depicted in FIG. 1 and FIGS. 2A and 2B with gaps therebetween, in some embodiments the ML array 130 is a gapless-type ML array in which individual ones of the MLs 136 abut other ones of the MLs. Furthermore, it is worth noting that in a gapless-type ML array that is configured with a linear ML shift, the square pitch size of the individual MLs may be constant or, alternatively, may vary. For example, in a gapless-type ML array with linear shift (e.g., the same amount of shift for each ML with respect to a corresponding pixel), the square pitch size of the individual MLs may be constant across the entire ML array. As another example, in a gapless-type ML array with non-linear shift (e.g., where the amount of shift for the individual MLs varies based on image height), the square pitch size of the individual MLs may vary across the ML array.

With respect to the individual MLs 136 within the ML array 130 varying in position (i.e., shift in relation to a center of a corresponding pixel 138), the first ML 136(1) may be radially shifted a first amount with respect to a center of the first pixel 138(1) whereas the Nth ML 136(N) may be radially shifted an Nth amount with respect to a center of the Nth pixel 138(N)—the first amount being different than the Nth amount. In some embodiments, positional shifts of the individual MLs 136 with respect to corresponding pixel 138 may be varied according to a distance from the axis 140 of the image lens 124 (or any other suitable reference datum of the 3D TOF camera 100). To illustrate this point, recall that the radial distance of the first ML 136(1) from the axis 140 is relatively less than the radial distance of the Nth ML 136(N) from the axis 140. Thus, due to these different radial distances from the axis, the position of the first ML 136(1) and the Nth ML 136(N) may be shifted different amounts with respect to centers of the first pixel 138(1) and the Nth pixel 138(N), respectively. In an exemplary embodiment, shifts of the individual MLs 136 with respect to a center of a corresponding pixel 138 may increase with increasing radial distance from the axis 140. Stated alternatively, the positional shifts of the individual MLs 136 with respect to a corresponding pixel 138 are directly (i.e., as opposed to inversely) related to the radial distance of those individual MLs 136 from the axis 140. To illustratively convey this point, the first ML 136(1) is shown in FIG. 1 to be substantially centered over the first pixel 138(1) due to being substantially centered on the axis 140. In contrast, however, the Nth ML 136(N) is shown in FIG. 1 to be shifted away from a center of the Nth pixel 138(N) and toward the optical axis 140 due to the Nth pixel 138(N) and, therefore, the Nth ML 136(N) being along the outer perimeter of the ML array 130 (e.g., distant from or not centered over the axis 140).

As described in more detail below, individual ones of the pixels 138 may include one or more photodetector cells that emit electric current (e.g., via the photoelectric effect) when stricken with incident light (e.g., rays 132). Within the present disclosure, electric current (or electric voltage for that matter) that is emitted by the one or more photodetector cells in response to incident light may be referred to as a photoelectric signal. In some embodiments, this photoelectric signal may be provided directly from the ML-TOF sensor 128 to the controller 102 which may analyze the photoelectric signal to determine per-pixel depth information associated with the physical object 118 and any other objects in a Field-of-View of the 3D TOF camera 100.

In some embodiments, the 3D TOF camera 100 may further include a phase shifter 142. The phase shifter 142 may also receive the modulated electrical signal 112 from the signal generator 110 and apply a phase shift including one or more phase shift steps to the modulated electrical signal 112. Then, the phase shifter 142 may transmit the modulated electrical signal 112 (or some variant thereof) that is received from the signal generator 110 to the ML-TOF sensor 128. The modulated electrical signal 112 that is provided to the ML-TOF sensor 128 may correlate with the photoelectric signal generated in response to the incident light striking the one or more photodetector cells (e.g., due to the backscattered light 126 including a portion of the modulated light 116). Thus, the modulation signal after the phase shifter 142 may demodulate the modulated electric signal 112 (which is provided from the signal generator 110 and in accordance with which the modulated light 116 is emitted) from the photoelectric signal to extract one or more components of the photoelectric signal that are specifically associated with modulated light 116 that is reflected off the physical object 118 toward the image lens 124. It will be appreciated that the signal resulting from the demodulation of the modulated electric signal 112 from the photoelectric signal may be a correlation electrical signal 144.

As illustrated, after the modulated electrical signal 112 has been demodulated from the photoelectric signal, the controller 102 may receive the correlation electrical signal 144 from the ML-TOF sensor 128. In some embodiments, the photoelectric signal and/or the correlation electrical signal 144 may be amplified prior to transmission to the controller 102. The controller 102 may be further configured to determine, based on a phase difference between the correlation electrical signal 144 and the modulated electrical signal 112, a time-of-flight of the reflected modulated light. It should be appreciated that the phase difference and time-of-flight may be determined on a per-pixel basis to generate the depth data requested by the application 106. The depth data may then be provided to the application 106 with an output signal 146.

An example algorithm by which the phase difference may be determined in some embodiments is provided below. The example algorithm is an algorithm for determining the phase difference between the correlation electrical signal 144 and a periodic-modulated electrical signal, e.g., a sinusoidal signal. In this example, the phase difference is determined for a simplified correlation between one frequency component of the photoelectric signal associated with modulated light 116 that is reflected off the physical object 118 and one frequency component associated with the modulated electrical signal 112. The correlation of the frequency components for one frame captured by a pixel 138 is given by Equation 1 as follows:

$$I_{0k} = CM_0 + AB_0 \cdot \cos(\varphi_{d0} + \psi_k) \quad \text{Eq. 1}$$

In Equation 1, $CM_0$ is a common mode voltage signal corresponding to a direct current (DC) signal received from the pixel 138. $CM_0$ includes signals associated with both the modulated light 116 emitted by the light emitter 114 and ambient light 120 emitted by the ambient light source 122. A formula for $CM_0$ is given below in Equation 2:

$$CM_0 = \frac{1}{N} \sum_k I_{0k} \quad \text{Eq. 2}$$

In Equation 2, N is the total number of phase shifting steps.

Returning to Equation 1, $AB_0$ is the amplitude of an alternating voltage of the modulated light 116, $\varphi_{d0} = 2\pi f t_{d0}$ is the phase of the time of flight $t_{d0}$, and $\psi_k$ the $k^{th}$ phase shift, being equal distributed within $2\pi$. A formula for $AB_0$ is given below in Equation 3:

$$AB_0 = \frac{2}{N} \sqrt{\left[\sum_k I_{0k} \cdot \sin(\psi_k)\right]^2 + \left[\sum_k I_{0k} \cdot \cos(\psi_k)\right]^2} \quad \text{Eq. 3}$$

In addition, a formula for $\varphi_{d0}$ is given below in Equation 4:

$$\varphi_{d0} = a\tan \frac{-\sum_k I_k \cdot \sin(\psi_k)}{\sum_k I_k \cdot \cos(\psi_k)} \text{ for } k = 1, 2, \ldots, N \geq 3 \quad \text{Eq. 4}$$

In Equation 4, $I_k$ is the correlation result of voltage output contributed by the photoelectric signal at the $k^{th}$ phase shifting step from each pixel 138.

Although the above example is provided for a single frequency, the above example may be extended to signals including multiple components with different frequencies by summing over the components. Thus, a single pixel 138 may concurrently provide time-of-flight data for a plurality of different wavelengths of light.

Turning now to FIGS. 2A and 2B, illustrated is a top view and a cross-sectional side view, respectively, of an exemplary micro lens time-of-flight (ML-TOF) sensor 200 having a ML array 202 configured with a plurality of individual MLs 204 that are manufactured with variable ML height and shift with respect to corresponding pixels 208. The cross-sectional side view shown in FIG. 2B is taken along the line A-A shown in FIG. 2A. In the illustrated example, the ML array 202 includes thirty-six individual MLs 204 that are each positioned with respect to an individual region-of-interest (ROI) 206 of a corresponding pixel 208 within a pixel array 210. It is worth noting that in each of FIGS. 2A and 2B, the MLs 204 are illustrated in dotted circle to represent its location and spherical or aspherical feature (rather than solid) lines. It is worth noting that the pitch of ML in general are square formed to have maximum fill factor assisted with gapless ML process technology. Individual ones of the MLs 204 uniquely correspond to and are specifically positioned with respect to individual ones of the pixels 208. For example, as illustrated in FIGS. 2A and 2B, a first ML 204(1) uniquely corresponds to and is specifically positioned with respect to a first ROI 206(1) of a first pixel 208(1), a second ML 204(2) uniquely corresponds to and is specifically positioned with respect to a second ROI 206(2) of a second pixel 208(2), and so on.

In some embodiments, the ROI 206 of an individual pixel 208 is a particular volume of photodetector material that is configured to emit electric signals in response to being stricken by incident backscattered modulated light. In this respect, a typical TOF pixel has a limited electrical field modulating area that projects to a particular depth (thereby forming a volumetric region-of-interest). Furthermore, in a typical TOF pixel this "volumetric" ROI represents a portion of the photodetector material of the TOF pixel that most effectively transfers electrons in response to photon stimulation. Thus, the ROI 206 of a pixel 208 is the region of that pixel 208 which is best suited for producing photoelectric signals with a high modulation frequency (e.g., 200 MHz or higher) such as that used in typical TOF sensors. Exemplary such ROIs 206 may be formed of an Epitaxy layer of Silicon.

Referring specifically to FIG. 2A, optical axes 212 for individual ones of the MLs 204 are graphically represented as a cross-mark that is bound by a square (⊠). In the illustrated embodiment, the optical axes 212 for each individual one of the MLs 204 are positioned with respect to an individual ROI 206 of a corresponding pixel 208 by an amount of shift that varies according to a distance of the corresponding pixel 208 from a reference datum 214 (graphically represented as ✪). An exemplary such reference datum 214 may be, for example, the optical axis 140 of the image lens 124 described in FIG. 1. To illustrate this variable shift that varies according to distance from the reference datum 214, within FIG. 2A individual ones of the optical axes 212 for the four MLs 204 at the four corners of the ML array 202 are shifted away from the center of the corresponding ROI 206 and toward the reference datum 214 by a greater distance than are the optical axes 212 for the four MLs 204 that touch the reference datum 214. Thus, in the illustrated embodiment, the amount of shift (e.g., measured in micrometers "μm") of each ML 204 with respect to a center of a corresponding pixel 208 increases with increasing distance from the reference datum 214. That is, the amount of shift of each ML 204 with respect to a corresponding pixel 208 is positively related to the distance of that ML 204 from the reference datum 214.

In some embodiments, the individual MLs 204 have geometric parameters (e.g., size, height, width, lens curvature, etc.) that vary according to distance from the reference datum 214. For example, in the embodiment illustrated in FIG. 2B, a first ML 204(1) through a sixth ML 204(6) are each shown to have geometric parameters of height and width that vary according to a distance from the reference datum 214. Here, a first height Hi is shown for the first ML 204(1) and a third height $H_3$ is shown for the third ML 204(3), where the first height Hi is less than the third height $H_3$. In the illustrated embodiment, the heights of the individual MLs 204 decrease with increasing distance from a reference datum 214. Specifically, the third height $H_3$ (which corresponds to MLs 204(3) and 204(4)—since these MLs are the same distance from the reference datum 214) is greater than a second height which corresponds to MLs 204(2) and 204(5) (note the second height is not labeled). Furthermore, the first height Hi is less than the third height $H_3$ and is also less than the second height Hz. Thus, in the illustrated embodiment, geometric size parameters (e.g., height and/or width) of the individual MLs 204 is inversely related to the distance of that ML 204 from the reference datum 214. As described in more detail below, the varying positional shifts and/or geometric parameters for the individual MLs may be optimized to maximize a volumetric optic power Hit Rate $R_{hit}$ as defined by Equations 9 and 10 below.

Figure 3:
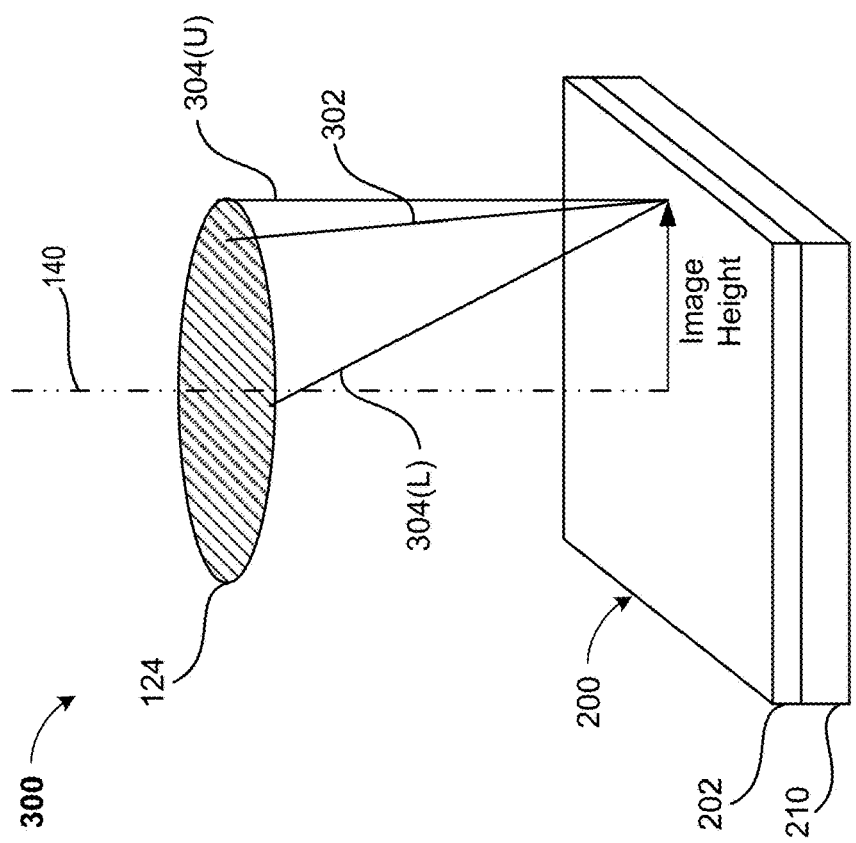
FIG. 3 illustrates an exemplary optical framework between an image lens and a micro lens time-of-flight (ML-TOF) sensor that is used to build a ML-TOF optimization model.

Turning now to FIG. 3, illustrated is an exemplary optical framework 300 between an image lens 124 and a micro lens time-of-flight (ML-TOF) sensor 200. The optical framework 300 is used to build a ML-TOF optimization model as described below. More specifically, by jointly modeling characteristics of the image lens 124 and the ML-TOF sensor 200 using the geometrical framework 300 in conjunction with the following mathematical framework, the geometric parameters (e.g., heights, shifts, etc.) of the individual MLs within an ML array 302 can be optimized to maximize the volumetric optic power Hit Rate $R_{hit}$ of the backscattered light into the silicon in the pixel modulation regions (i.e., the volumetric deep depletion region).

Figure 8:
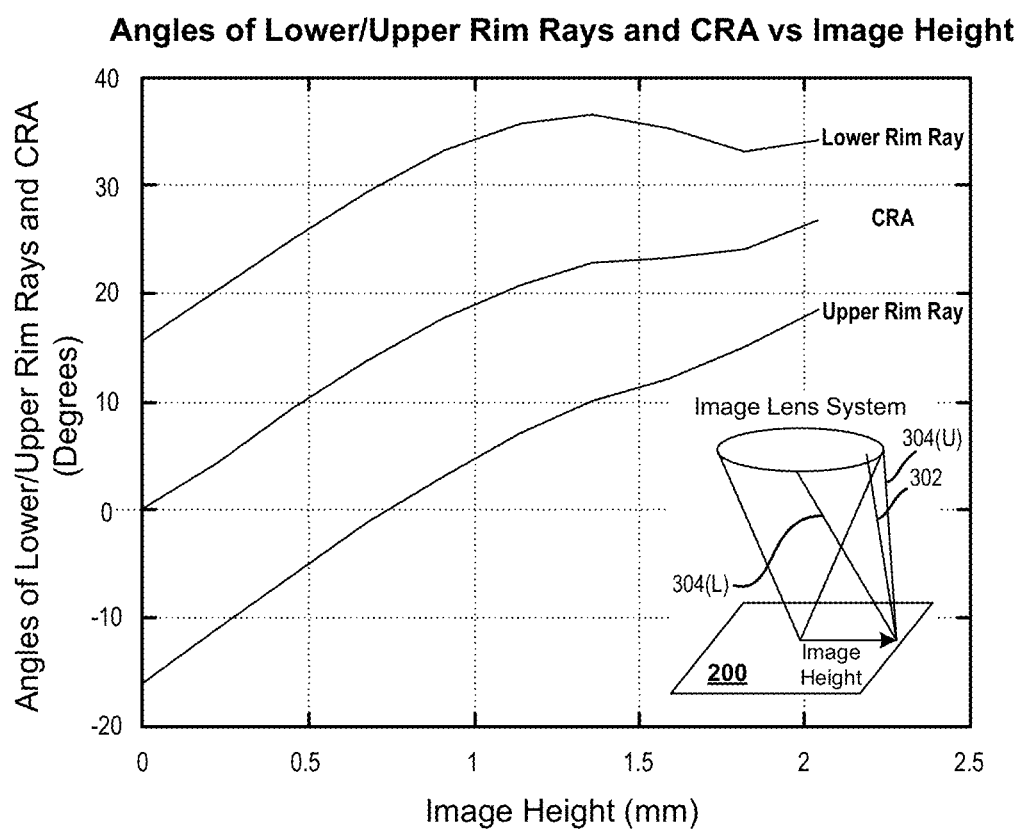
FIG. 8 is a graph that shows a non-linear relationship between image height for the exemplary optical framework of FIG. 3 with respect to each of a lower rim ray and an upper rim ray 304(U) and a chief ray angle.

The present framework accounts for a variety of design differences between the characteristics of TOF pixels and normal image pixels. One such design difference corresponds to typical TOF sensors using active infrared (IR) light to stimulate photoelectric signals from which depth information may be correlated. For example, a TOF sensor may actively emit IR light at a wavelength range at or near 850 nanometers which has a penetration depth into silicon of roughly 20 μm. This penetration depth is more than six times that of visible light (e.g., roughly 3 μm) that normal image pixels are designed to detect. Furthermore, rather than using the chief ray angle 302 as typically used in conventional optical models, the present framework uses projections of rim rays 304 (i.e., rays projected from the marginal portion of the image lens 124) which have relatively larger incident angles as compared to the chief ray angle 302 as outer boundaries for cones of randomly generated input rays. In particular, input rays on a multitude of points that span the entire surface area of the ML array 202 are generated and constrained within an optical ray cone that is bound by the upper rim ray 304(U) and lower rim ray 304(L) around the chief ray angle 302 (as described in relation to FIG. 8). Using this framework, photon volume density metrics may be calculated based on a Fresnel power hitting rate to optimize the design of the ML-TOF sensor 128. For example, and as described in more detail below in relation to FIG. 4, multiple different ROI projection slices may be defined and then weighted by their corresponding absorption behaviors.

Figure 4:
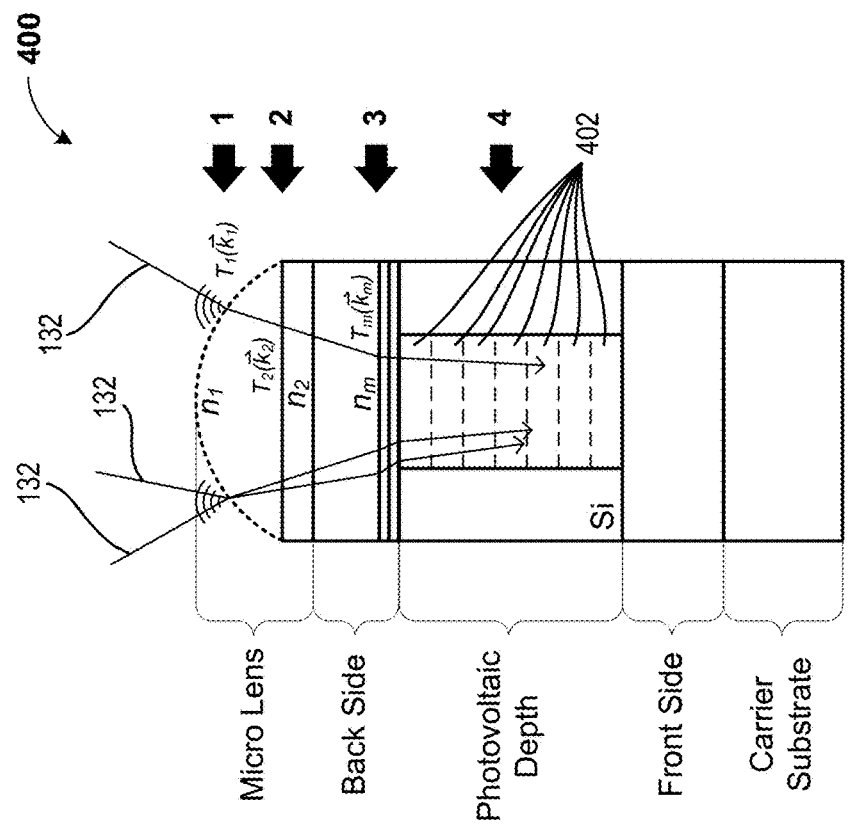
FIG. 4 illustrates an exemplary optical framework for a single pairing of a pixel and corresponding micro lens within an exemplary micro lens time-of-flight (ML-TOF) sensor.

Turning now to FIG. 4, illustrated is an exemplary optical framework 400 for a single pairing of a pixel and corresponding micro lens within the exemplary micro lens time-of-flight (ML-TOF) sensor 200. In the following discussion, the exemplary optical framework 400 is discussed in terms of a sequence of four regions that are identified with solid black arrows that are individually numbered one through four.

Referring specifically to the first region, a plurality of rays 132 are modeled at a multitude of points on the surface of a micro lens. In particular, at individual ones of these multitude of points, a cone-shaped bundle of input rays 132 is formed that is bound by the upper and lower rim rays (described in relation to FIGS. 3 and 8). These cone-shaped bundles of input rays 132 may be generated by Monte Carlo methods or various other repeated random sampling techniques. That is, the specific parameters for each individual cone-shaped bundle of input rays 132 is determined by the upper rim ray 304(U) and the lower rim ray 304(L) of the image lens 124 as varied by different image heights as shown in FIG. 3 (e.g., radial distances from the axis 140 of the image lens 124). It is worth noting that although merely 3 input rays 132 are shown in FIG. 4, practical implementations of the techniques described herein may include generating hundreds or even thousands of input rays 132 in association with any individual micro lens.

Referring specifically now to the second region, the curvature (e.g., height) and offset (e.g., shift) of the micro lens is optimized to maximize the volumetric optic power Hit Rate $R_{hit}$ as described below. Referring specifically now to the third region, the rays 132 are modeled as propagating through a back side of the optical framework 400 such as, for example, a Backside Illuminated (BSI). In various implementations, the optimization techniques described herein account for various refractive indexes such as a first refractive index $n_1$ of the micro lens, a second refractive index $n_2$ of an oxidation layer that forms a ML Pedestal Height within the micro lens layer, and an $m^{th}$ refractive index $n_m$ within back side of the optical framework 400. Referring specifically now to the fourth region, the volumetric region of interest (ROI) of an exemplary pixel is represented with seven ROI projection slices 402 shown. It should be appreciated that these several slices represent the deep depletion region of the illustrated TOF pixel. As described in detail below, these so-called ROI projection slices 402 are used for volumetric optimization.

Next, an advanced formulation for a volumetric optic power Hit Rate $R_{hit}$ is defined based on the foregoing optical frameworks 300 and 400 of FIGS. 3 and 4. The following volumetric optic power Hit Rate $R_{hit}$ is usable to optimize the photon volumetric density within the regions of interest of the individual pixels within a ML-TOF sensor 200 based on the following parameters. Within the advanced formulation, the power transmittance $T(\vec{k})$ of individual rays 132 within the various coned bundles (e.g., that are bound by the upper rim ray 304(U) and the lower rim ray 304(L)) through all optical mediums is defined by Equation 5 as follows:

$$T_M(\vec{k}) = \Pi_{m=1}^{M} T_m(\vec{k})$$  Eq. 5 where $T_m(\vec{k})$, which is denoted by ray vector $\vec{k}$, is related to the Fresnel's transmittance with S and P polarized waves carried by the $k^{th}$ ray vector at $m^{th}$ medium boundary of the optical framework 400 (e.g., a Backside Illuminated "BSI" process stack). The boundary number m is counted from the outer surface of the micro lens at which m=1 to the volumetric region of interest (ROI) (e.g., silicon) at which m=M. In some implementations in which the various mediums, e.g., through which the rays 132 propagate, have absorption, optical complex indexes may be applied.

Next, the transmittance summation $T_{As}(j)$, which is the summation of the transmittance for all of the rays 132 in the volumetric "pipe" of the photodetector material (e.g., silicon) bounded by the projection of the optically active area As (i.e., the ROI at a given depth j inside of the photodetector material), is defined by Equation 6 as follows:

$$T_{As}(j) = \Sigma_{k \in As} T_M(\vec{k})$$  Eq. 6

Then, an average of the transmittance T with all ROI projection slices 402 of varying depth number $N_j$ is defined by Equation 7 as follows:

$$T = \frac{1}{N_j} \sum_j T_{As}(j)$$  Eq. 7

In implementations in which absorption of the photodetector material is taken into account, a depth weighted version of Equation 7 can be defined by Equation 8 as follows:

$$T = \frac{1}{N_j} \sum_j \left[ \left( \frac{e^{-\alpha \cdot j}}{\sum_j e^{-\alpha \cdot j}} \right) \cdot T_{As}(j) \right]$$  Eq. 8 where α the silicon absorption coefficient at given wavelength, if the depth j in μm, then α~1/20 at a wavelength of 850 nm.

Based on the foregoing, the volumetric optic power Hit Rate $R_{hit}$ is defined by Equation 9 as follows:

$$R_{hit} = \frac{T}{N} = \frac{1}{N \cdot N_j} \sum_j T_{As}(j)$$  Eq. 9 where N is the total number of rays generated for the optimization. Furthermore, for an absorption weighted case, the volumetric optic power Hit Rate $R_{hit}$ is defined by Equation 10 as follows:

$$R_{hit} = \frac{T}{N} = \frac{1}{N \cdot N_j} \sum_j \left[ \left( \frac{e^{-\alpha \cdot j}}{\sum_j e^{-\alpha \cdot j}} \right) \cdot T_{As}(j) \right]$$  Eq. 10 where again N is the total number of rays generated for the optimization.

Deploying the foregoing advanced formulation for maximizing volumetric optic power Hit Rate $R_{hit}$ provides several benefits. One such benefit is maximizing the number of rays 132 that become directed through or constrained within the ROI of each pixel. Due to the longer wavelength and, therefore deeper penetration into the photodetector material, of the IR modulated light, maximizing the number of rays 132 constrained within the ROI of each pixel is especially important for TOF sensors as compared to normal image sensors. Another such benefit is providing for minimization of the Fresnel reflection by optimizing curvature of each micro lens to best respond to all of the modeled rays within the cone bundle bound by the larger angular upper rim ray 304(U) and lower rim ray 304(L) as opposed to the chief ray angle 302. The ultimate result of deploying the foregoing formulation to optimize the ML array 200 is a maximized photon power within the relevant volume of the ROI—thereby maximizing the modulation efficiency while minimizing crosstalk.

Turning now to FIG. 5, illustrated are a plurality of ray tracing responses 500 that are modeled based on various ML lens parameters and with incoming light modeled as columnated light that is parallel to the axis of the image lens. Stated alternatively, the modeled incoming rays of light are all parallel to the axis of the image lens prior to striking the illustrated micro lens within each scenario. Each of these four different scenarios are optimized in accordance with various design criteria. More specifically, illustrated in FIG. 5 are four different scenarios (scenarios 5A through 5D), each of which have a corresponding ray tracing response (labeled 500(A) through 500(D)) which is modeled based on corresponding ML lens parameters as defined in Table 1 below. In each scenario, the incoming light is modeled as columnated light being received at a zero ("0") incident angle condition (i.e., propagating straight down as shown in FIG. 5). Furthermore, the ML lenses are modeled as being spherical lenses in each of scenarios 5A through 5D. With respect to the optimization criteria used in each of these scenarios: scenario 5A is optimized to have a focal point 504(A) designed at the top of the ROI 502(A), scenario 5B is optimized to have a focal point 504(B) at the mid-point of the ROI 502(B), scenario 5C is optimized to have a focal point 504(C) at the bottom of the ROI 502(C), and scenario 5D is optimized to have a volumetric criterion in which the focal point 504(D) is somewhere below the ROI 502(D)—as indicted by the arrow directed downward. Table 1 which tabulates the ML lens parameters is shown below as follows:

TABLE 1

Micro Lens Type Parameters for FIGS. 4 and 5

| ML type | ML size [µm] | ML radius curvature [µm] | ML height [µm] | ML pedestal Height [µm] |
|---|---|---|---|---|
| A | 3.5 × 3.5 | 2.23 | 2.47 | 2.5 |
| B | 3.5 × 3.5 | 2.31 | 1.7 | 2.1 |
| C | 3.5 × 3.5 | 2.47 | 1.4 | 1.4 |
| D | 3.5 × 3.5 | 2.40 | 1.5 | 0.1 |

As can be appreciated from FIG. 5, designing to a single focal point is non-optimal for a TOF pixel due to the deep penetration of the long wavelength of IR light into the photodetector material.

Figure 6:
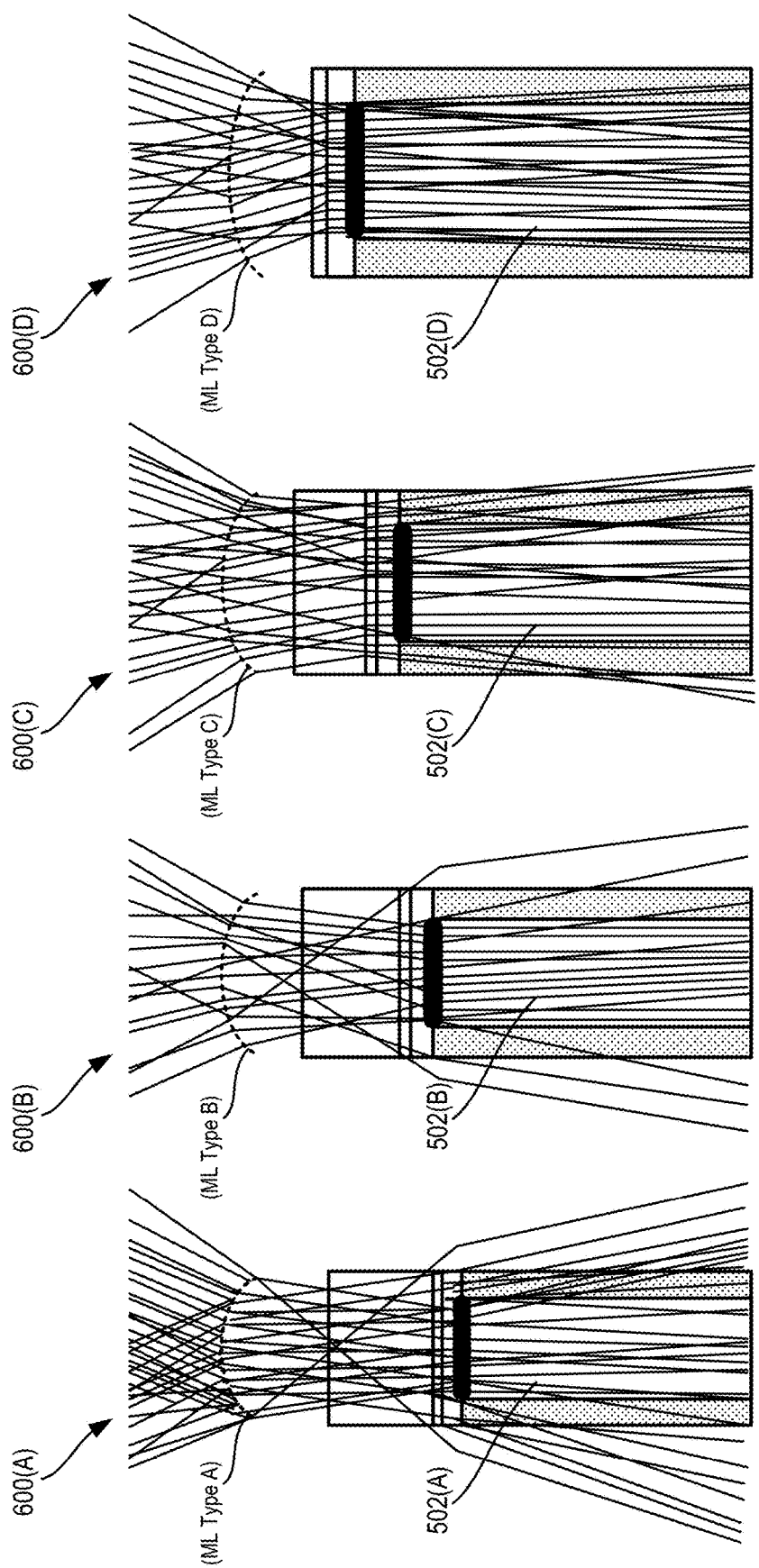
FIG. 6 illustrates a plurality of ray tracing responses that are modeled based on the same ML lens parameters as used in FIG. 5 but with incoming light modeled as non-columnated light rays that are bound by the upper rim ray and lower rim ray described in relation to FIG. 3.

Turning now to FIG. 6, illustrated are a plurality of ray tracing responses 600 that are modeled based on the same ML lens parameters of FIG. 5 and with incoming light modeled as non-columnated light that is bound by the upper rim ray 304(U) and lower rim ray 304(L) described in relation to FIG. 3. It can be appreciated that modeling the incoming rays as bound between the upper rim ray 304(U) and lower rim ray 304(L) (e.g., +15 degrees to −15 degrees, or some other degree range), yields significantly different ray tracing responses than those shown in FIG. 5. Moreover, since in real-life TOF implementations incoming light is received at the image lens and micro lens from many different angles (not simply the CRA 302), the ray tracing responses 600 of FIG. 6 represent significantly more accurate predictions of real-life optical behavior than the ray tracing responses 500 of FIG. 5.

As illustrated, each of the four scenarios modeled in FIG. 6 effectively direct some portion of the modeled incoming light into the region of interest 502 (i.e., the photoactive region of the pixel). This portion of the modeled incoming light that is directed into the corresponding region of interest specifically corresponds to the volumetric optic power Hit Rate $R_{hit}$ as defined by Equations 9 and 10 above. As illustrated in FIG. 6, each of ML Type A and ML Type B as shown in Scenario 6A and Scenario 6B direct a substantial amount of incoming light outside of the corresponding region of interest 502. This could potentially result in undesirable crosstalk between neighboring pixels. In contrast, each of ML Type C and ML Type D as shown in Scenario 6C and Scenario 6D direct a substantial amount of incoming light into the corresponding region of interest 502—although as shown in FIG. 6 not all incoming rays are perfectly contained within the ROI 502(D). Furthermore, with specific reference to Scenario D, as shown in FIG. 6, the ML Type D effectively re-directs and constrains nearly all incoming light into the region of interest 502(D). Thus, Scenario D represents the highest volumetric optic power Hit Rate $R_{hit}$ shown in FIG. 6.

Figure 7:
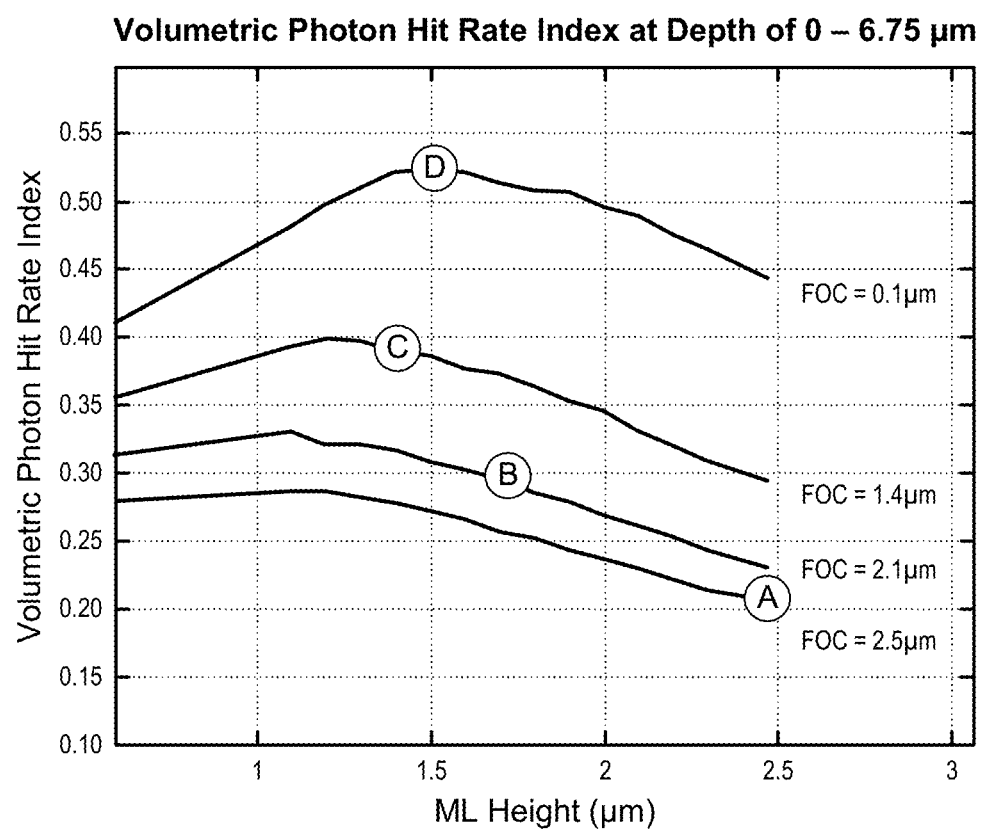
FIG. 7 is a graph that shows the volumetric optic power Hit Rates for various optical scenarios—including those that are modeled and described in relation to FIG. 6.

Turning now to FIG. 7, illustrated is a graph that shows the volumetric optic power Hit Rates for various optical scenarios—including those that are modeled and described in relation to FIG. 6. More specifically, each of the lines that are graphed in FIG. 7 correspond to an optical model in which incoming light rays are modeled as striking each point of a micro lens from a multitude of different angles (e.g., however many are randomly modeled using Monte Carlo methods) that are bound by an upper rim ray and lower rim ray of +15 degrees and −15 degrees, respectively. Furthermore, each individually graphed line corresponds to a model of a micro lens have a particular ML size, ML radius curvature, and ML pedestal height (e.g., referred to as FOC in FIG. 7) as described in Table 1 above. Then, for each optical scenario modeled, the volumetric optic power Hit Rates are determined across a range of ML Heights as indicated by the lower axis of the graph in FIG. 7. In this way, optical parameters for each individual micro lens within a micro lens array of a TOF sensor can be identified so as to achieve the highest volumetric optic power Hit Rate.

On each one of the lines graphed in FIG. 7 is a specifically labeled point that corresponds to one of the scenarios described in relation to FIG. 6. In particular, the point labelled A within FIG. 7 corresponds to Scenario 6A which is described in relation to FIG. 6, the point labelled B within FIG. 7 corresponds to Scenario 6B which is described in relation to FIG. 6, and so on. Furthermore, it can be appreciated from FIG. 7 that the highest volumetric photon hit rate that was modeled during the generation of the graph of FIG. 7 corresponds to Scenario 6D of FIG. 6. Thus, an examination of a graph similar to that shown in FIG. 7 reveals the optical parameters (e.g., the ML Height, ML Pedestal Height, ML Radius Curvature) which are usable to achieve an optimal (e.g., maximized) volumetric photon hit rate for each pixel within a pixel array based on the image height of that pixel within the pixel array as described in relation to FIG. 3.

In an exemplary implementation, an optimization procedure for identifying the optimal TOF-ML parameters (e.g., ML Curvature, Pedestal Height, etc.) at each different image array location (e.g., each pixel) includes deploying Monte Carlo methods to generate a predetermined number of input rays (e.g., 60,000 input rays) with random incident angles that are constrained by the lens output rim ray cone (e.g., rather than the chief ray angle) as described in relation to FIG. 3. For example, for a centrally located pixel within a pixel array, the upper rim ray 304(U) and lower rim ray 304(L) may form a lens output rim ray cone that extends from +15 degrees to −15 degrees. Thus, for this centrally located pixel, the optimization procedure may include generating 60,000 input rays that strike this pixel at a randomly determined angle that is somewhere between +15 degrees to −15 degrees. It should be appreciated that the angular constraints of these randomly generated input rays will vary at different sensor locations (e.g., image heights). For example, generally speaking the lens output rim ray cone will have different tiling angles related to the chief ray angle at different sensor locations. With respect to this point, FIG. 8 graphically illustrates the angles for each of the lower rim ray 304(L), the upper rim ray 304(U), and the chief ray angle (CRA) 302 vs image height for the exemplary optical framework 300 of FIG. 3.

Turning now to FIG. 9, illustrated are a plurality of ray tracing responses 900 that demonstrate an effect of shifting micro lenses with respect to a region of interest 502 of a pixel on the volumetric optic power Hit Rate. More specifically, FIG. 9 shows three ray tracing responses (labeled 900(A) through 900(C)) that each correspond to different optical circumstances. For purposes of the present discussion, each of Scenarios 9A through 9C have common optical circumstances of being modeled with a ML Height of 2.1 mm, a ML Radius Curvature of 2.23 µm, and a ML Oxidation Pedestal of 0.35 µm.

Referring now specifically to Scenario 9A, illustrated is a ray tracing response 900(A) that corresponds to a pixel that is centrally located on a pixel array 210 of a ML-TOF sensor 200 (e.g., a pixel at the Image Height=0). Under such circumstances, it can be appreciated the chief ray angle for this centrally located pixel is zero. Therefore, referring to FIG. 8, the optical ray cone that is generated (e.g., using Monte Carlo methods to generate 60,000 input rays of varying incoming angles and that strike varying points on the micro lens) for this centrally located pixel has been constrained within a rim-ray range of +15 degrees to −15 degrees (as defined in FIG. 8). Furthermore, in Scenario 9A which has been modeled to generate the ray tracing response 900(A), the micro lens is modeled as having zero shift in relation to the region of interest 502(A). That is, the micro lens in Scenario 9A is modeled as being centered over the region of interest 502(A) of the corresponding pixel. As illustrated, in the ray tracing response 900(A) modeled in association with Scenario 9A, the bulk of the rays are well contained within the region of interest 500(A).

Referring now specifically to Scenarios 9B and 9C, illustrated are ray tracing responses that corresponds to a pixel that is located around the peripheral region (outer region) of the pixel array 210 of the ML-TOF sensor 200 (e.g., a pixel at an Image Height greater than zero). More specifically, in Scenarios 9B and 9C the pixel is offset from the axis 140 of the image lens 124 such that the CRA is 26.83 degrees. It should be appreciated that this specific CRA is arbitrarily chosen for illustrative purposes only and that many of CRAs could also be used to convey the concepts described in relation to FIG. 9. Based on this specific CRA of 26.83 degrees, FIG. 8 reveals that the optical ray cone that is to be generated for a pixel with this specific image height is constrained within a rim-ray range of +34.26 degrees to +18.55 degrees.

Referring specifically now to Scenario 9B of FIG. 9, the illustrated ray tracing response 900(B) is generated based on the micro lens being modeled as having zero shift in relation to the region of interest 502(B). That is, the micro lens in Scenario 9B is modeled as being centered over the region of interest 502(B) of the corresponding pixel—just as it was in Scenario 9A. As illustrated, in the ray tracing response 900(B) that results from the optical model of Scenario 9B, the bulk of the rays are not directed into the region of interest 500(B)—the result being a much lower volumetric optic power Hit Rate $R_{hit}$ as compared to Scenario 9A. In particular, based on the specific optic parameters described above and used to generate the ray tracing responses 900(A) and 900(B), the volumetric optic power Hit Rate $R_{hit}$ of Scenario A is 0.8307 whereas the volumetric optic power Hit Rate $R_{hit}$ of Scenario B is a substantially lower 0.1881. Thus, Scenario 9B would yield worse modulation efficiency as compared to Scenario 9A.

Scenario 9C is similar to Scenario 9B with the exception that the micro lens is not modeled as being modeled as being shifted 1.1 μm toward the axis 140 of the image lens 124. As illustrated, in the ray tracing response 900(C) modeled in association with Scenario 9C, the bulk of the rays are directed into the region of interest 500(B) (Note: the region of interest in both Scenario 9B and 9C is labeled 500(B) because they are each modeled in association with the same pixel). In plain terms, the shifting of the micro lens from Scenario 9B to 9C results in a corresponding shift of the resulting ray tracing response 900(C) into the region of interest 500(B)—the result being a much higher volumetric optic power Hit Rate $R_{hit}$ in Scenario 9C as compared to Scenario 9B. In particular, the addition of the 1.1 μm shift to the micro lens placement results in the volumetric optic power Hit Rate $R_{hit}$ of Scenario C increasing to 0.7919.

Figure 10:
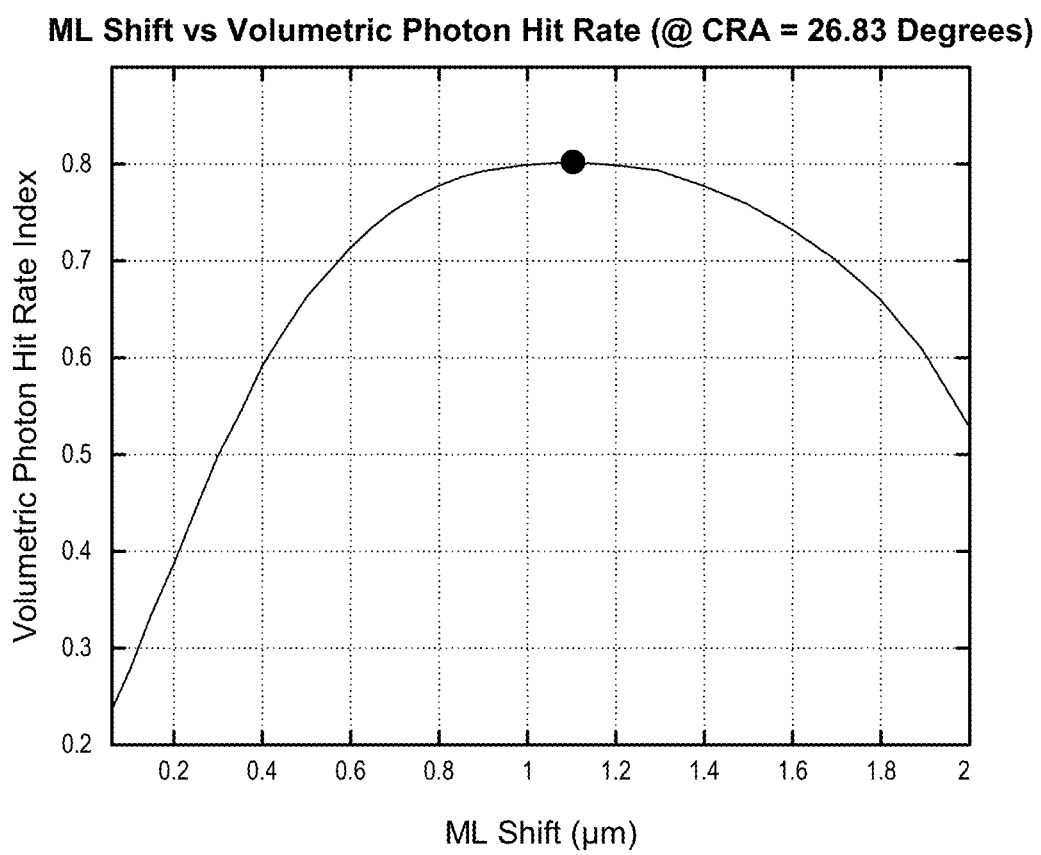
FIG. 10 is a graph of the effect of shifting a micro lens within an ML-TOF Sensor for a pixel having a predetermined image height (e.g., as indicated by the chief ray angle) on the volumetric photon hit rate experienced at that pixel.

Turning now to FIG. 10, illustrated is a graphical representation of the effect of shifting the micro lens within an ML-TOF Sensor for a pixel having a predetermined image height (e.g., as indicated by the chief ray angle) on the volumetric photon hit rate experienced at that pixel. Here, the optical parameters used to generate the graphical representation shown in FIG. 10 are the same as those used to generate the ray tracing responses 900(B) and 900(C) shown in FIG. 9. As illustrated, for a pixel having an image height of greater than zero (and therefore having a CRA of greater than zero), the maximum volumetric photon hit rate does not result from the micro lens being perfectly centered over the region of interest of a corresponding pixel (i.e., having a shift of zero). Rather, for TOF pixels having such an offset from the axis of an image lens, the volumetric photon hit rate increases with increasing ML shift until a maximum is reached—after which additional shift results in the volumetric photon hit rate decreasing. As illustrated in FIG. 10, under the specific optical parameters used to model the scenario (e.g., CRA=26.83 degrees, ML Pedestal=0.35 ML Height=2.1 μm, etc.), this maximum volumetric photon hit rate is achieved at an ML Shift of 2.1 μm toward the axis of the image lens.

Figure 11:
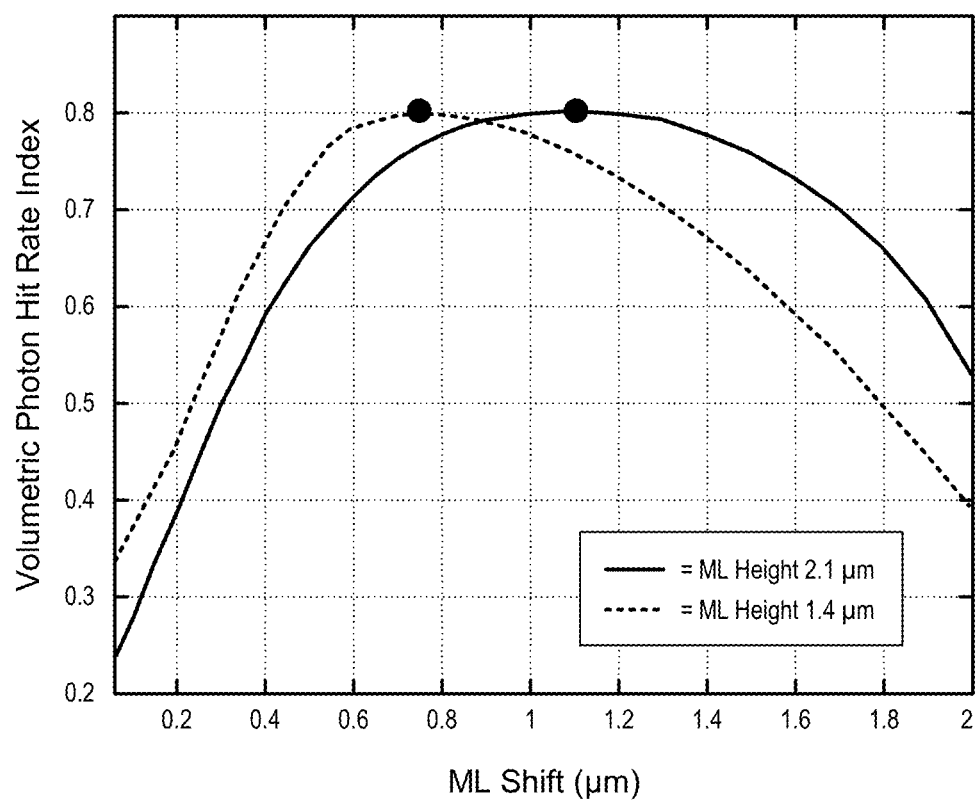
FIG. 11 is a graph of the effect of shifting two different micro lenses, each having a different height, within an ML-TOF Sensor for a pixel having a predetermined image height on the volumetric photon hit rate experienced at that pixel.

Turning now to FIG. 11, illustrated is a graphical representation of the effect of shifting two different micro lenses, each having a different height, within an ML-TOF Sensor for a pixel having a predetermined image height on the volumetric photon hit rate experienced at that pixel. In particular, the graphical representation of FIG. 11 is similar to that of FIG. 10 with the exception that ML shift optimization results are graphed for a pixel having a CRA of 26.83 degrees under circumstances where a corresponding micro lens has a height of 2.1 μm and also under alternate circumstances where a corresponding micro lens has a height of 1.4 μm. It is worth noting that while only two lines are graphed—each corresponding to a particular ML Height—many more lines could potentially be included and examined to identity optimal optical parameters. As a specific but nonlimiting example, the graph of FIG. 11 could potentially include a line corresponding to a ML Height of 1.1 μm, another line corresponding to a ML Height of 1.2 μm, yet another line corresponding to a ML Height of 1.3 μm, and so on. As can be appreciated from FIG. 11, under the modeled circumstances for a pixel residing on a pixel array at the particular image height, utilizing a micro lens having an ML height of 1.4 μm at an ML shift of 0.75 μm yields roughly the same volumetric photon hit rate as does utilizing a micro lens having a relatively larger ML height of 2.1 μm at a relatively larger ML shift of 1.1 μm.

Figure 12:
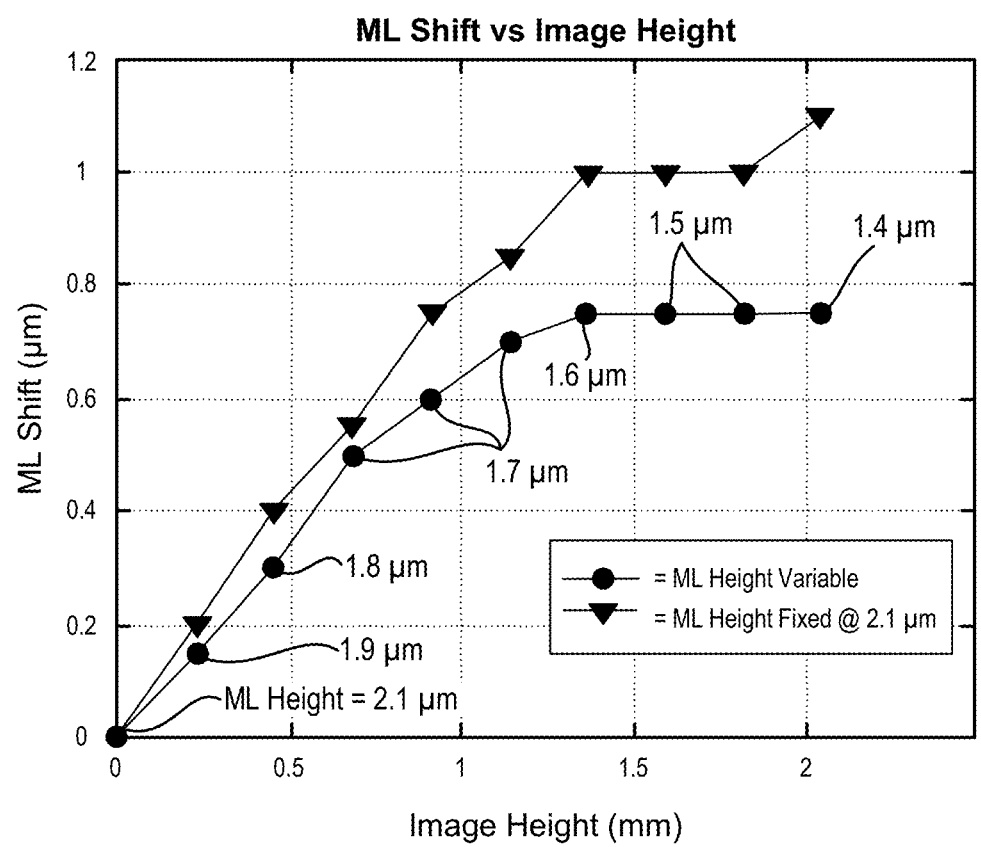
FIG. 12 is a graph that represents a relationship between the micro lens shift and image height for two different optical models that result in similar volumetric optic power Hit Rate $R_{hit}$.
Figure 13:
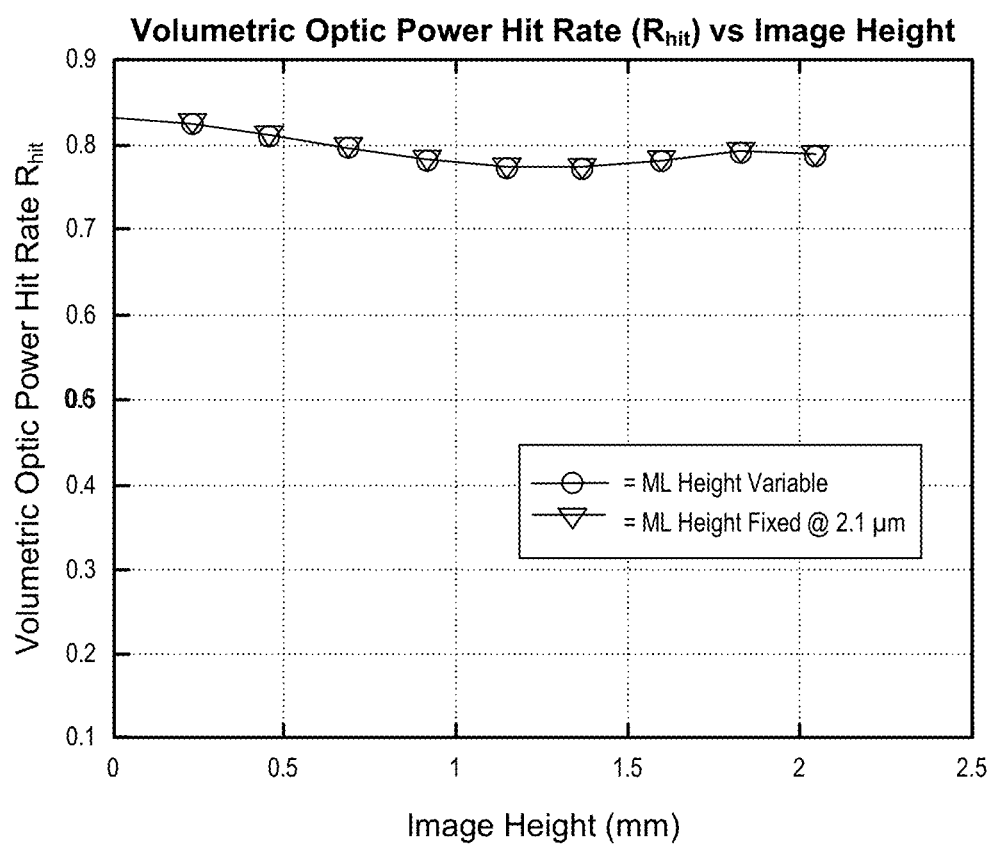
FIG. 13 is a graph that shows the similarity in volumetric optic power Hit Rate $R_{hit}$ for the two optical models described and shown in FIG. 12.

Turning now to FIG. 12, illustrated is a graph that represents a relationship between the micro lens shift and image height for two different optical models that result in similar volumetric optic power Hit Rate $R_{hit}$. In particular, the graph of FIG. 12 includes a line with points marked as black circles and that corresponds to an optical model in which the height of micro lenses within a micro lens array are varied in accordance with image height as described above. Adjacent to each black circle on this line is a numerical indication of the ML Height selected at a corresponding image height (e.g., using the techniques above). The graph of FIG. 12 further includes a line with points marked as black triangles and that corresponds to an optical model in which the height of micro lenses within a micro lens array remain constant (e.g., at 2.1 μm) regardless of image height. As can be seen from FIG. 12, the shift needed to achieve a similar volumetric optic power Hit Rate $R_{hit}$ at each image height is relatively less for the variable ML Height optical model as compared to the constant ML Height optical model. FIG. 13 is a graph that shows the similarity in volumetric optic power Hit Rate $R_{hit}$ for the two optical models described and shown in FIG. 12. It can be appreciated from FIG. 13 that by deceasing the ML Heights of the micro lenses within an ML array with increasing image height, a similar volumetric optic power Hit Rate $R_{hit}$ can be achieved as if the ML Heights remained constant but with less ML Shift. Thus, it can be appreciated that there is no performance lost by decreasing both the ML Height and ML Shift as compared to an implementation in which ML Lenses of constant Height are shifted varying amount based on increasing Image Height. In this way, each ML may have different curvature and shift to achieve best modulation efficiency and QE as well to reduce ML shift amount. It will be appreciated by one skilled in the art that an ability to reduce ML shift amount is highly beneficial in terms of manufacturability, optical lens-ML-TOF array axis alignment robustness, as well the ML design flexibility because in many conventional manufacturing processes the ability to shift these parameters may be limited by the process quanta/resolution. The foregoing techniques, therefore, allow ML shift amount to be adjustable to fit the manufacturing and/or design parameters that are possible with the designed parameters closing to the optimized results.

In some embodiments, the heights of the individual MLs 136 within the ML array are linearly proportional to the radial distance of the individual MLs 136 from the axis 140. As a specific but nonlimiting example, suppose that at a center point of the ML array that intersects with the axis a ML Height is set to 2.1 μm and that at an edge of the ML array an ML height is set to 1.4 μm. Under these circumstances, the ML Height for the individual MLs would linearly vary from a maximum ML height of 2.1 μm at the center of the pixel array to a minimum ML height of 1.4 μm at the outermost edge of the ML array.

In some embodiments, the heights of the individual MLs 136 within the ML array are non-linearly proportional to the radial distance of the individual MLs 136 from the optical axis 140. To illustrate this point, presume that the variable ML heights shown in FIG. 12 along the "ML Height Variable" line are selected for a particular ML-TOF Sensor design. Under these circumstances, a polynomial-based best fit line may be generate based on an ML Height of 2.1 μm at an Image Height of 0 mm, an ML Height of 1.9 μm at an Image Height of 0.23 mm, and so on. It is worth noting that this Optimized Numeric Data shown in FIG. 12 is also represented in Table 2 herein. Then, this newly determined polynomial-based best fit line may be used to prescribe specific ML Heights at the various Image Heights.

In some embodiments, the shifts of the individual MLs 136 within the ML array are linearly related to the radial distance of the individual MLs 136 from the axis 140. As a specific but nonlimiting example, suppose that at a center point of the ML array that intersects with the axis a ML shift is set to 0.0 μm (e.g., the ML is perfectly centered over a corresponding pixel) and that at an edge of the ML array an ML shift is set to 0.75 μm. Under these circumstances, the ML shift for the individual MLs would linearly vary from a minimum ML shift of 0.0 μm at the center of the pixel array to a maximum ML shift of 0.75 μm at the outermost edge of the ML array.

In some embodiments, the shifts of the individual MLs 136 within the ML array are non-linearly proportional to the radial distance of the individual MLs 136 from the optical axis 140. To illustrate this point, presume that the variable ML shifts shown in FIG. 12 along the "ML Height Variable" line are selected for a particular ML-TOF Sensor design. Under these circumstances, a polynomial-based best fit line may be generate based on an ML shift of 0.0 μm at an Image Height of 0 mm, an ML shift of 0.15 μm at an Image Height of 0.23 mm, and so on. That is, a best fit line may be generated based on the 10 unique ML Shift vs. Image Height Data points shown in Table 2. Then, this newly determined polynomial-based best fit line may be used to prescribe specific ML shifts at the various Image Heights.

Figure 14A:
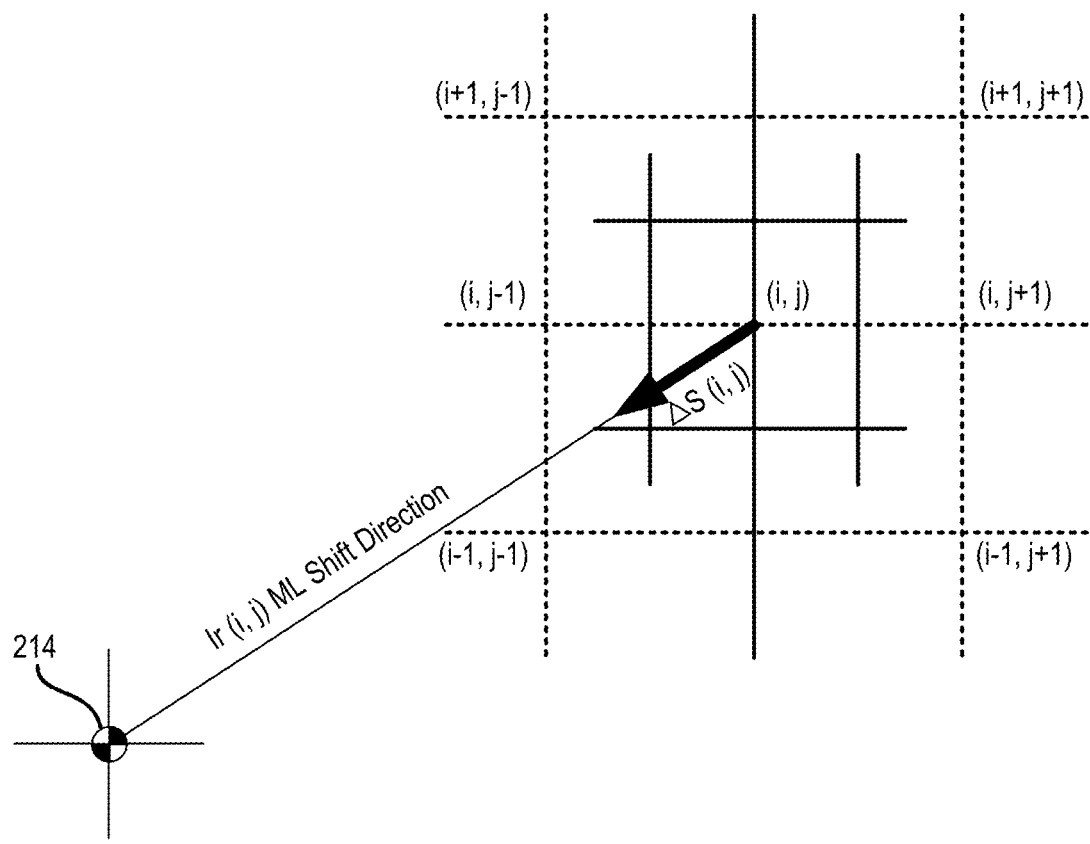
FIG. 14A illustrates an exemplary geometrical framework for defining an interpolation function for determining optimal micro lens shifts based on a relationship between image height and ML Height.
Figure 14B:
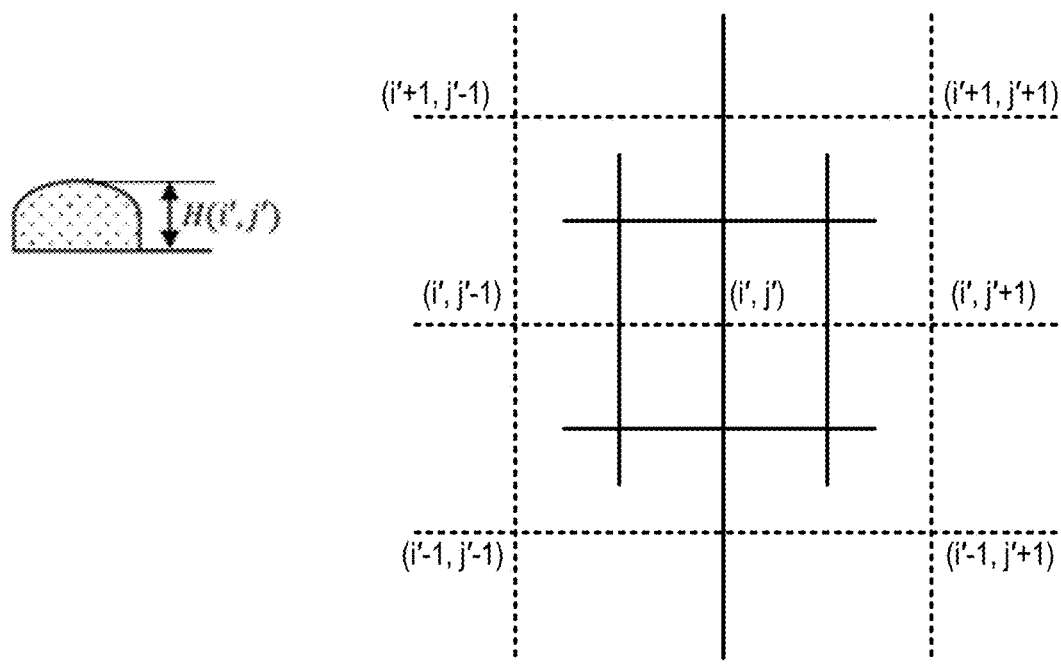
FIG. 14B illustrates an exemplary geometrical framework that is usable for determining a new ML height and pitch size based on a new central location for the ML that is determined based on the shift illustrated in FIG. 14A.

Turning now to FIG. 14A, illustrated is an exemplary geometrical framework for defining an interpolation function for determining optimal micro lens shifts based on a relationship between image height and ML Height. Furthermore, FIG. 14B illustrates an exemplary geometrical framework that is usable for determining a new ML height and pitch size based on the new central location (i', j') for the ML that is determined based on the shift illustrated in FIG. 14A. With reference to FIG. 14A, an interpolation function for Variable ML shift according to simulation data presented in FIG. 12 (also represented in Table 2 below) is given by Equation 11 as follows:

$$\Delta S(i,j) = \text{Func1}(Ir(i,j)) \qquad \text{Eq. 11}$$

where (i, j) is the location of the center of a pixel in relation to a reference datum 214. In Equation 11, $\Delta S(i, j)$ represents the ML shift distance away from the center of the pixel along the radius image height $Ir(i, j)$ (i.e., toward the center of the sensor array with regards to the position of ML without shift). In various implementations, the interpolation function Func1($Ir(i, j)$) is a polynomial-type best fit function. Other types of functions suitable for determining a best fit are also suitable and contemplated for use in accordance with the disclosed techniques.

TABLE 2

Example of Optimized numeric data of ML shifts and Variable ML height vs Image Height at 3.5 um TOF pixel condition

| # | 1 | 2 | 3 | 4 | 5 | 6 | 7 | 8 | 9 | 10 |
|---|---|---|---|---|---|---|---|---|---|---|
| Image Height [mm] | 0.00 | 0.23 | 0.45 | 0.68 | 0.91 | 1.14 | 1.36 | 1.59 | 1.82 | 2.04 |
| ML shift [um] | 0 | 0.15 | 0.30 | 0.50 | 0.60 | 0.70 | 0.75 | 0.75 | 0.75 | 0.75 |
| ML Height [um] | 2.1 | 1.9 | 1.8 | 1.7 | 1.7 | 1.6 | 1.5 | 1.5 | 1.5 | 1.4 |

Based on the Optimized Numerical Data in Table 2, one of the approximated ML shift functions can be formed as follows in Equation 12:

$$\Delta S(i,j) = 0.05783 \cdot Ir(i,j)^3 - 0.41074 \cdot Ir(i,j)^2 + 0.9665 \cdot Ir(i,j) \qquad \text{Eq. 12}$$

Then, after the approximated ML shift above, the Optimized Numerical Data in Table 2 is used to make an interpolation of ML height in related to the simulation data (labeled in FIG. 12 or in Table 2) based on Equation 13 as follows:

$$H(i',j') = \text{Func2}(Ir(i',j')) \qquad \text{Eq. 13}$$

where (i', j') is the pixel location index representing the pixel central point after shifting from location (i, j), and where H(i', j') is the shifted variable ML height at the radius image height Ir(i', j') to the center of the sensor (i.e., the datum 214). In various implementations, the interpolation function Func2(Ir(i', j')) is a polynomial-type best fit function or any other type of function suitable for best fitting the ML Height Data Points of FIG. 12 (also in Table 2). In this way, one of the approximated variable ML height functions can be generated from Table 2 as follows in Equation 14:

$$H(i',j') = -0.11106 \cdot Ir(i',j')^3 + 0.46177 \cdot Ir(i',j')^2 - 0.81488 \cdot Ir(i',j') + 2.087 \qquad \text{Eq. 14}$$

Here, it should be appreciated that the variable ML height related to the ML shift at location (i, j), as well the shift direction and quantity is illustrated in FIG. 14A. After the ML shift as shown in FIG. 14A is determined, the ML pitch size centered at (i',j') is confined by the adjacent central points of the shifted ML: A rectangular surrounded by four lines; each line is passing through the middle of the adjacent points. In general, each shifted ML is with different pitch size, as well different height.

Figure 15:
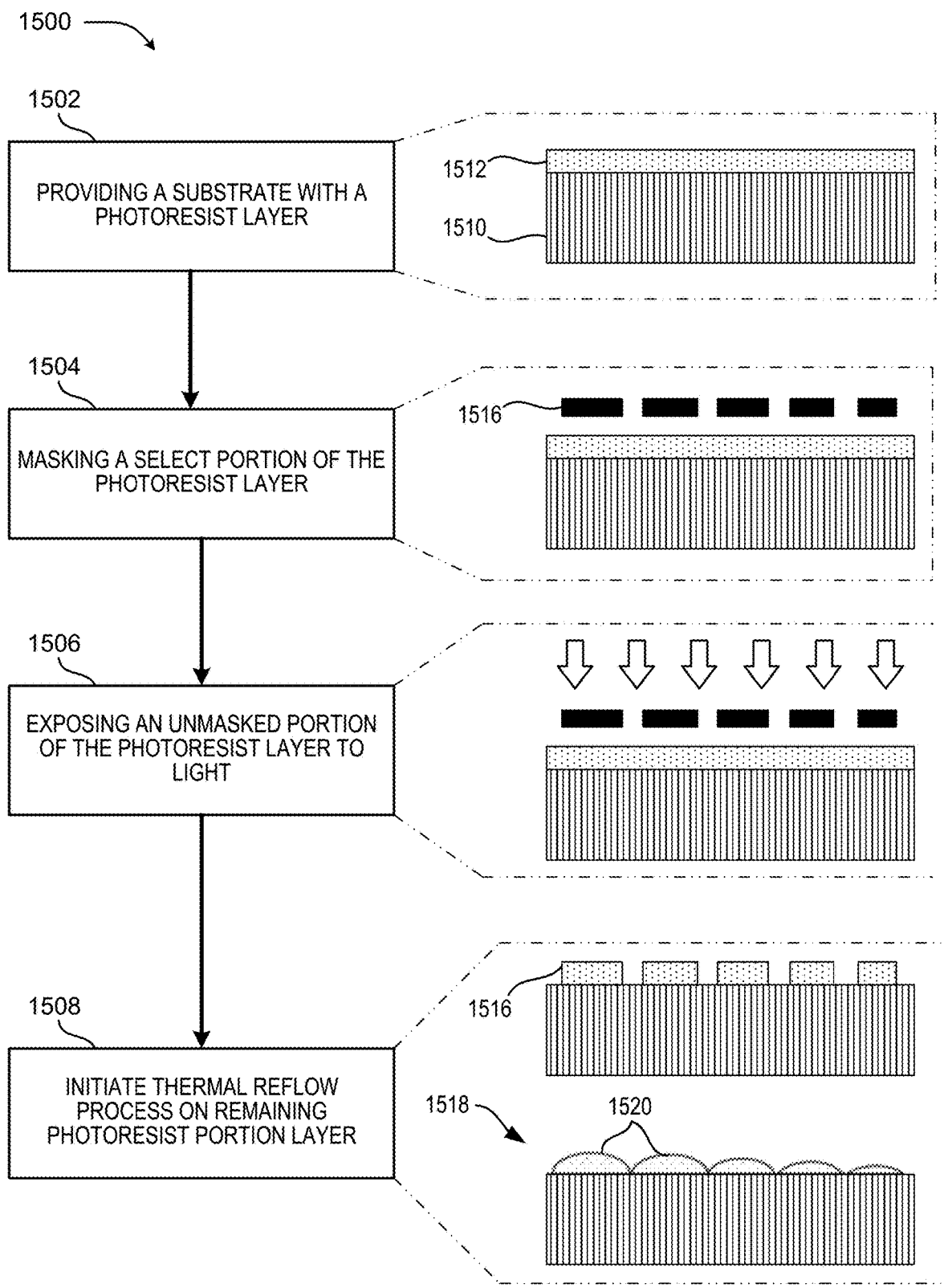
FIG. 15 is a pictorial flow diagram that graphically illustrates an exemplary process for manufacturing a ML array in accordance with the techniques described herein.

Turning now to FIG. 15, illustrated is an exemplary pictorial flow diagram that graphically illustrates an exemplary process 1500 for manufacturing a ML array in accordance with the characteristics determined based on the frameworks described above in relation to FIGS. 14A and 14B.

At block 1502, a substrate 1510 is provided that has a photoresist layer 1512 deposited thereon. The photoresist layer 1512 may have a uniform thickness and still be used to form a ML array having MLs with variable height and/or curvatures as described below.

At block 1504, a mask 1506 is disposed adjacent to the photoresist layer 1512 to mask a select portion of the photoresist layer. The mask may be a suitable opaque material to prevent the select portion from being exposed to some form of light such as, for example, Ultra-Violet light.

At block 1506, an unmasked portion of the photoresist layer is exposed to light that is suitable for shaping the photoresist layer based on the mask 1516. For example, UV light may be emitted toward the substrate and photoresist layer with the mask blocking some portion of this UV light from reaching the select portion of the photoresist layer.

At block 1508, a thermal reflow process is initiated on a remaining portion 1516 of the photoresist layer. The result of the thermal reflow process is formation of a ML array 1518 having individual MLs 1520 which vary in size and height.

The following detailed methodology is provided to facilitate using the thermal reflow process to achieve the ML array 1518 with variable ML height and size from a photoresist layer 1512 having a constant thickness. More specifically, based on the simulation results that are achieved for each individual pixel as described in relation to FIGS. 14A and 14B, a ML volume can be calculated and converted into a carriable photoresist pitch size at a given photoresist layer thickness condition.

The following methodology is described with respect to a single representative pixel at original location (i, j), while the ML shifted center is located at (i', j') with the variable gapless ML size being, while the ML shifted center is located at (i', j') with the variable gapless ML size A'(i', j') and its photo resist size a(i', j'), a(i', j'). Based on these defined parameters, the ML processed by thermal reflow can be approached as square shaped ML with spherical surface, thus the ML volume V(i', j') at the said location (i', j') can be expressed as equation 14 below:

$$V(i',j') = \iint \sqrt{R(i',j')^2 \cdot (x^2 + y^2)} \, dx\, dy \qquad \text{Eq. 14}$$

where R(i', j') is the ML curvature at location (i', j'), the variable (x, y) represent ML area integrating variables over the ML pitch size area A'(i', j'), and the terms dx and dy represent the corresponding integration infinitesimals. It will be appreciated that the gapless ML pitch size is generally smaller than the pixel size due to the ML shift, typically the ML pitch size reduction with regards to pixel size is round 1-2 nm. Thus, it may be acceptable to use the original pixel size (e.g., 3.5 μm) as a good approximation for the integral.

Based on the foregoing, the radius of curvature to variable ML high H(i', j') at the same location as associate with Eq. 14 can be expressed by Equation 15 as follows:

$$V(i',j') = \iint \sqrt{\left\{0.5 \left[\frac{d05(i',j')^2}{H(i',j')} + H(i',j')\right]\right\}^2 - (x^2 + y^2)} \, dx\, dy \qquad \text{Eq. 15}$$

where d05(i', j') is a half of the diagonal dimension of the ML pitch at location (i', j'). Therefore, the photo resist pitch size can determine by the volume balance as defined in Equation 16 below:

$$a(i',j') \cdot T = \iint \sqrt{\left\{0.5 \cdot \left[\frac{d05(i',j')^2}{H(i',j')} + H(i',j')\right]\right\}^2 - (x^2 + y^2)} \, dx\, dy \qquad \text{Eq. 16}$$

Thus, the variable photo resist pitch area size can be expressed as $$a(i',j') = 1/T \iint \sqrt{\left\{0.5 \cdot \left[\frac{d05(i',j')^2}{H(i',j')} + H(i',j')\right]\right\}^2 - (x^2 + y^2)} \, dx\, dy \qquad \text{Eq. 17}$$

In embodiments in which the photoresist layer is square shaped, the pitch side dimension is then $\sqrt{a(i',j')}$. It should be appreciated that the integrals in Eq. 14-17 can be resolved by numeric method or any other available methods. Furthermore, the ML photoresist pitch size is also radial symmetrical. Based on several characterized values of a(i', j') along radius Image height Ir(i', j'), an interpolation function for pitch size can be defined by Equation 18 as follows:

$$a(i',j') = \text{Func3}(H(i,j)) \qquad \text{Eq. 18}$$

The interpolated function Func3(H(i, j)) can be a polynomial or any form of the best fitting function representing the variable ML photoresist pitch size as shown in FIG. 15. For convenience of pattern design algorithm Eq. 18 can be also expressed as $$a(i',j') = \text{Func3}(Ir(i',j')) \qquad \text{Eq. 19}$$

Based on the foregoing equations, the variable ML photoresist size has been defined as function of Image height Ir(i', j'). Assuming the photoresist thickness T=2.4 um for 3.5 um pixel process, we have the characterized data given in Table. 3:

An example of characterized data of variable ML height and photoresist pitch size vs. image height is provided in Table 3 as follows:

TABLE 3

Example of Characterized data of variable ML height, and Photoresist Pitch size vs Image Height

| ML identifier | 1 | 2 | 3 | 4 | 5 | 6 | 7 | 8 | 9 | 10 |
|---|---|---|---|---|---|---|---|---|---|---|
| Image Height [mm] | 0.00 | 0.23 | 0.45 | 0.68 | 0.91 | 1.14 | 1.36 | 1.59 | 1.82 | 2.04 |
| ML Height [um] | 2.1 | 1.9 | 1.8 | 1.7 | 1.7 | 1.6 | 1.5 | 1.5 | 1.5 | 1.4 |
| ML photoresist pitch size [um] At height 6 um | 2.8919 | 2.72125 | 2.6345 | 2.5465 | 2.5465 | 2.4577 | 2.3675 | 2.3675 | 2.3675 | 2.2759 |

By using the data in Table 3, an exemplary approximated ML photoresist pitch sizing functions can be defined as follows in Equation 20:

$$a(i',j') = -0.05294 \cdot Ir(i',j')^3 + 0.22844 \cdot Ir(i',j')^2 - 0.42956 \cdot Ir(i',j') + 1.8211 \quad \text{Eq. 20}$$

Figure 16:
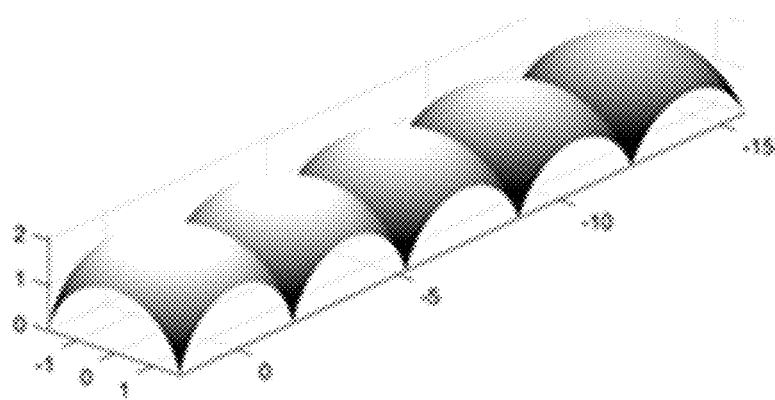
FIG. 16 is an exemplary portion of a gapless-type square pitched ML array that is formed with variable height and/or shift in accordance with the techniques described herein.

Turning now to FIG. 16, illustrated is an exemplary portion of a gapless-type square pitched ML array that can formed with variable height and shift in accordance with the techniques described herein. In particular, the portion of the ML array illustrated in FIG. 16 includes variable heights and variable shifts that are determined as described above in relation to FIGS. 1 through 14B and FIG. 17. It should be appreciated that the illustrated surfaces shown in FIG. 16 represent a spherical lens geometry for individual MLs within the ML array.

Figure 17:
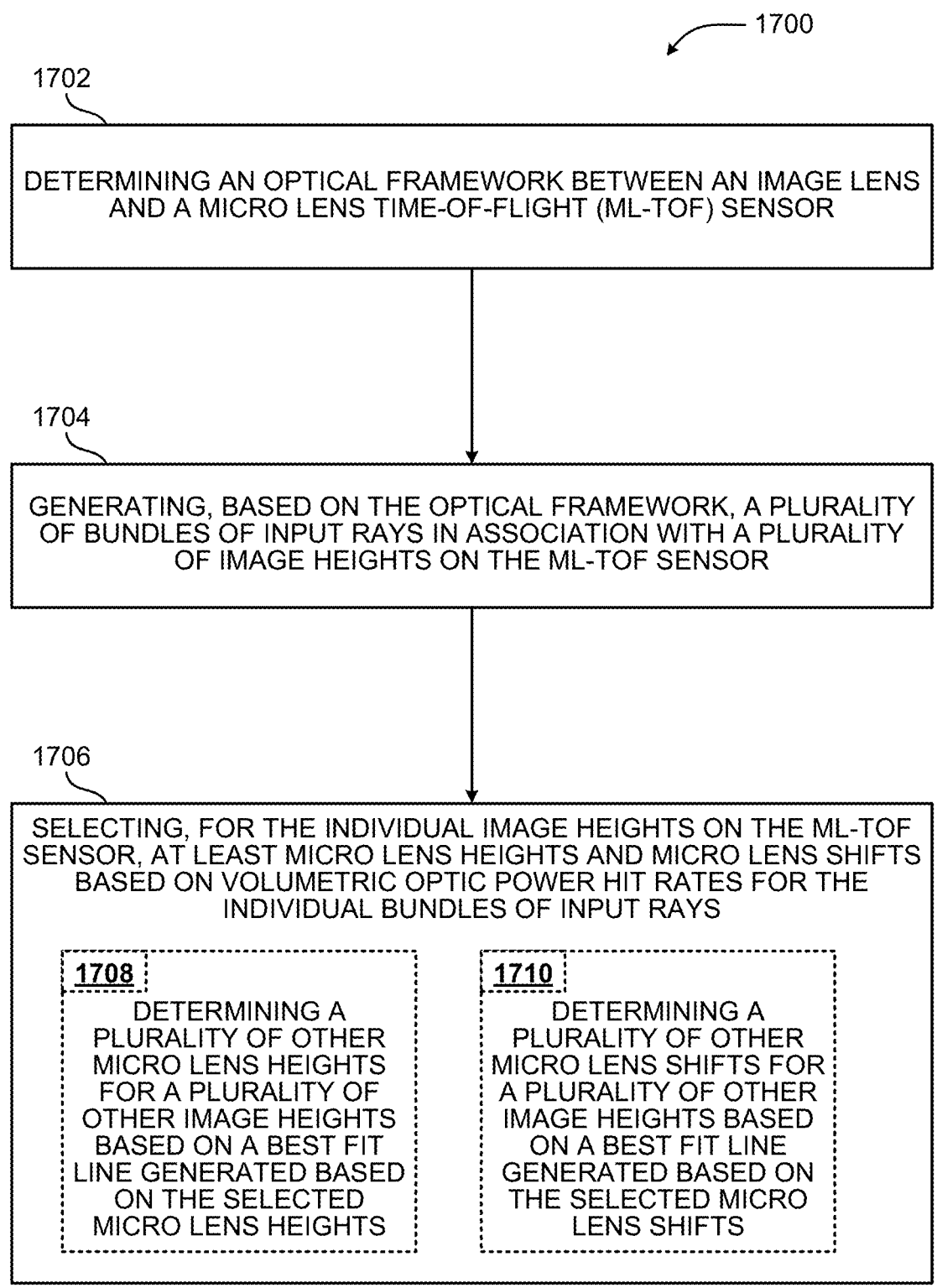
FIG. 17 illustrates an exemplary process for designing a micro lens time-of-flight (ML-TOF) sensor in accordance with the techniques described herein.

Turning now to FIG. 17, illustrated is an exemplary process 1700 for designing a micro lens time-of-flight (ML-TOF) sensor in accordance with the techniques described herein.

At block 1702, an optical framework between an image lens and the ML-TOF sensor being designed is determined. An exemplary such optical framework is shown in FIG. 3 which graphically illustrates a relationship between a ML-TOF sensor 200 and an image lens 124. As illustrated, the optical framework 300 is usable to determine one or more of a chief ray angle between the image lens and a particular image height, a lower rim ray for the particular image height, and an upper rim ray for the particular image height.

At block 1704, the optical framework determined at block 1702 is used to generate a plurality of bundles of input rays in association with a plurality of image heights on the ML-TOF sensor. Exemplary such bundles of input rays are illustrated in FIGS. 6 and 9. Furthermore, as described above, various optical parameters such as, for example, ML Height, ML shift, ML Pedestal Height, and/or ML curvature can be strategically varied in association with individual pixels to calculate a plurality of different potential volumetric optic power hit rates that could be achieved at the individual pixels.

At block 1706, micro lens heights and micro lens shifts are selected for individual image heights of the ML-TOF sensor under design. More specifically, the micro lens heights and micro lens shifts are selected based on the different calculated potential volumetric optic power hit rates that could be achieved at the individual pixels.

In some embodiments, the process 1700 includes determining other micro lens heights and/or other micro lens shifts based on discrete numbers of micro lens heights and micro lens shifts selected at block 1706 for a discrete number of image heights. For example, with particular reference to FIG. 12 and Table 2, the 10 micro lens heights and 10 micro lens shifts determined for the 10 image heights (e.g., tabulated in Table 2) can be used to generate best fit lines.

At block 1708, a best fit line that is generated based on a discrete number of micro lens heights is used to determine a plurality of other micro lens heights across the ML-TOF sensor under design. The best fit line may be linear or non-linear.

At block 1710, a best fit line that is generated based on a discrete number of micro lens shifts is used to determine a plurality of other micro lens shifts across the ML-TOF sensor under design. The best fit line may be linear or non-linear.

EXAMPLE CLAUSES

The disclosure presented herein may be considered in view of the following clauses.

Example Clause A, a three-dimensional time-of-flight image camera, comprising: a signal generator configured to generate a modulated electrical signal; a light emitter configured to emit modulated light in accordance with the modulated electrical signal; an image lens configured to receive backscattered light that includes at least a portion of the modulated light; a pixel array that includes a plurality of pixels that are configured to generate photoelectric signals in response to the portion of the modulated light; and a micro lens array that includes a plurality of micro lenses having a plurality of different micro lens heights, wherein individual micro lenses are configured with individual micro lens heights that are inversely related to image heights of the individual micro lenses with respect to an axis of the image lens.

Example Clause B, the three-dimensional time-of-flight image camera of Example Clause A, wherein the micro lens heights are linearly proportional to the image heights of the individual micro lenses with respect to an axis of the image lens.

Example Clause C, the three-dimensional time-of-flight image camera of any one of Examples Clauses A through B, wherein the micro lens heights are non-linearly related to the image heights of the individual micro lenses with respect to an axis of the image lens.

Example Clause D, the three-dimensional time-of-flight image camera of any one of Examples Clauses A through C, wherein the individual micro lenses are further configured with individual micro lens shifts, with respect to corresponding individual pixels, that are directly related to the image heights of the individual micro lenses with respect to the axis of the image lens.

Example Clause E, the three-dimensional time-of-flight image camera of Example Clause D, wherein the individual micro lens shifts are non-linearly related to the image heights of the individual micro lenses with respect to an axis of the image lens.

Example Clause F, the three-dimensional time-of-flight image camera of Example Clause D, wherein the individual micro lens shifts correspond to maximized volumetric photon hit rates for individual bundles of input rays that are bound between upper rim rays and lower rim rays extending from the image lens to the individual micro lenses.

Example Clause G, the three-dimensional time-of-flight image camera of any one of Examples Clauses A through F, wherein the plurality of micro lenses includes at least: a first micro lens to direct the portion of the modulated light into a first region of interest of a first pixel at a first image height with respect to the axis of the image lens, wherein the first micro lens has a first micro lens shift with respect to the first pixel and a first micro lens height; and a second micro lens to direct the portion of the modulated light into a second region of interest of a second pixel at a second image height with respect to the axis of the image lens, wherein the second micro lens has a second micro lens shift with respect to the second pixel and a second micro lens height, wherein the first micro lens height is greater than the second micro lens height and the first micro lens shift is less than the second micro lens shift based on the first image height being less than the second image height.

Example Clause H, the three-dimensional time-of-flight image camera of any one of Examples Clauses A through G, further comprising a controller configured to generate depth data based at least in part on demodulation of the modulated electrical signal from the photoelectric signals that result from the portion of the modulated light being directed through the plurality of micro lenses having the plurality of different micro lens heights that are inversely related to the image heights of the individual micro lenses.

Example Clause I, a time-of-flight camera, comprising: a light emitter to illuminate a physical object with modulated light that is emitted in accordance with a modulated electrical signal; an image lens configured to transmit backscattered light that is reflected by the physical object, the backscattered light including a reflected portion of the modulated light; and a micro lens time-of-flight (ML-TOF) sensor to generate photoelectric signals in response to the backscattered light that is transmitted through the image lens, the ML-TOF sensor including: a plurality of pixels that are configured to generate the photoelectric signals, and a plurality of micro lenses that are configured to focus the backscattered light into regions of interest of the plurality of pixels, the plurality of micro lenses configured with micro lens heights and micro lens shifts that vary based on image heights with respect to an axis of the image lens.

Example Clause J, the time-of-flight camera of Example Clause I, wherein the micro lens heights are inversely related to the image heights.

Example Clause K, the time-of-flight camera of any one of Example Clauses I though J, wherein the micro lens shifts are directly related to the image heights.

Example Clause L, the time-of-flight camera of any one of Example Clauses I though K, wherein both of the micro lens heights and the micro lens shifts are non-linearly related to the image heights.

Example Clause M, the time-of-flight camera of any one of Example Clauses I though L, wherein individual amounts for the micro lens shifts correspond to maximized volumetric photon hit rates for individual bundles of input rays that are bound between upper rim rays and lower rim rays extending from the image lens to individual ones of the plurality of micro lenses.

Example Clause N, the time-of-flight camera of any one of Example Clauses I though M, wherein the plurality of micro lenses are further configured with spherical curvature radiuses that vary based on image heights with respect to an axis of the image lens.

Example Clause O, the time-of-flight camera of any one of Example Clauses I though N, further comprising a controller configured to generate depth data based at least in part on demodulation of the modulated electrical signal from the photoelectric signals.

Example Clause P, a method, comprising: determining an optical framework between an image lens and a micro lens time-of-flight (ML-TOF) sensor having a plurality of pixels that form a pixel array; generating, based on the optical framework, a plurality of bundles of input rays in association with a plurality of image heights on the ML-TOF sensor, wherein individual bundles of input rays correspond to individual image heights on the ML-TOF sensor, and wherein the individual bundles of input rays are constrained between upper rim rays and lower rim rays that extend from the image lens to the individual image heights on the ML-TOF sensor; selecting, for the individual image heights on the ML-TOF sensor, at least micro lens heights and micro lens shifts based on volumetric optic power hit rates for the individual bundles of input rays.

Example Clause Q, the method of Example Clause P, wherein selecting a particular micro lens shift for a particular image height includes identifying a maximum volumetric photon hit rate that a micro lens of a particular micro lens height achieves at the particular image height.

Example Clause R, the method of any one of Example Clauses P through Q, further comprising: generating a best fit line based on the micro lens shifts for the individual image heights on the ML-TOF sensor; and determining a plurality of other micro lens shifts for a plurality of other image heights based on the best fit line.

Example Clause S, the method of any one of Example Clauses P through R, further comprising: generating a best fit line based on the micro lens heights for the individual image heights on the ML-TOF sensor; and determining a plurality of other micro lens heights for a plurality of other image heights based on the best fit line.

Example Clause T, the method of any one of Example Clauses P through T, wherein both of the micro lens heights and the micro lens shifts are non-linearly related to the image heights.

CONCLUSION

In closing, although the various techniques have been described in language specific to structural features and/or methodological acts, it is to be understood that the subject matter defined in the appended representations is not necessarily limited to the specific features or acts described. Rather, the specific features and acts are disclosed as example forms of implementing the claimed subject matter.

What is claimed is:

1. A three-dimensional time-of-flight image camera, comprising:
   a signal generator configured to generate a modulated electrical signal;
   a light emitter configured to emit modulated light in accordance with the modulated electrical signal;
   an image lens configured to receive backscattered light that includes at least a portion of the modulated light;
   a pixel array that includes a plurality of pixels that are configured to generate photoelectric signals in response to the portion of the modulated light; and
   a micro lens array that includes a plurality of micro lenses having a plurality of different micro lens heights, wherein individual micro lenses are configured with individual micro lens heights that are inversely related to image heights of the individual micro lenses with respect to an axis of the image lens.

2. The three-dimensional time-of-flight image camera of claim 1, wherein the micro lens heights are linearly proportional to the image heights of the individual micro lenses with respect to an axis of the image lens.

3. The three-dimensional time-of-flight image camera of claim 1, wherein the micro lens heights are non-linearly related to the image heights of the individual micro lenses with respect to an axis of the image lens.

4. The three-dimensional time-of-flight image camera of claim 1, wherein the individual micro lenses are further configured with individual micro lens shifts, with respect to corresponding individual pixels, that are directly related to the image heights of the individual micro lenses with respect to the axis of the image lens.

5. The three-dimensional time-of-flight image camera of claim 4, wherein the individual micro lens shifts are non-linearly related to the image heights of the individual micro lenses with respect to an axis of the image lens.

6. The three-dimensional time-of-flight image camera of claim 4, wherein the individual micro lens shifts correspond to maximized volumetric photon hit rates for individual bundles of input rays that are bound between upper rim rays and lower rim rays extending from the image lens to the individual micro lenses.

7. The three-dimensional time-of-flight image camera of claim 1, wherein the plurality of micro lenses includes at least:
   a first micro lens to direct the portion of the modulated light into a first region of interest of a first pixel at a first image height with respect to the axis of the image lens, wherein the first micro lens has a first micro lens shift with respect to the first pixel and a first micro lens height; and
   a second micro lens to direct the portion of the modulated light into a second region of interest of a second pixel at a second image height with respect to the axis of the image lens, wherein the second micro lens has a second micro lens shift with respect to the second pixel and a second micro lens height, wherein the first micro lens height is greater than the second micro lens height and the first micro lens shift is less than the second micro lens shift based on the first image height being less than the second image height.

8. The three-dimensional time-of-flight image camera of claim 1, further comprising a controller configured to generate depth data based at least in part on demodulation of the modulated electrical signal from the photoelectric signals that result from the portion of the modulated light being directed through the plurality of micro lenses having the plurality of different micro lens heights that are inversely related to the image heights of the individual micro lenses.

9. A time-of-flight camera, comprising:
   a light emitter to illuminate a physical object with modulated light that is emitted in accordance with a modulated electrical signal;
   an image lens configured to transmit backscattered light that is reflected by the physical object, the backscattered light including a reflected portion of the modulated light; and
   a micro lens time-of-flight (ML-TOF) sensor to generate photoelectric signals in response to the backscattered light that is transmitted through the image lens, the ML-TOF sensor including:
      a plurality of pixels that are configured to generate the photoelectric signals, and
      a plurality of micro lenses that are configured to focus the backscattered light into regions of interest of the plurality of pixels, the plurality of micro lenses configured with micro lens heights and micro lens shifts that vary based on image heights with respect to an axis of the image lens.

10. The time-of-flight camera of claim 9, wherein the micro lens heights are inversely related to the image heights.

11. The time-of-flight camera of claim 10, wherein the micro lens shifts are directly related to the image heights.

12. The time-of-flight camera of claim 11, wherein both of the micro lens heights and the micro lens shifts are non-linearly related to the image heights.

13. The time-of-flight camera of claim 9, wherein individual amounts for the micro lens shifts correspond to maximized volumetric photon hit rates for individual bundles of input rays that are bound between upper rim rays and lower rim rays extending from the image lens to individual ones of the plurality of micro lenses.

14. The time-of-flight camera of claim 9, wherein the plurality of micro lenses are further configured with spherical curvature radiuses that vary based on image heights with respect to an axis of the image lens.

15. The time-of-flight camera of claim 9, further comprising a controller configured to generate depth data based at least in part on demodulation of the modulated electrical signal from the photoelectric signals.

* * * * *